(12) United States Patent
Guo et al.

(10) Patent No.: US 11,217,358 B2
(45) Date of Patent: Jan. 4, 2022

(54) TRANSPARENT AND FLEXIBLE CONDUCTORS MADE BY ADDITIVE PROCESSES

(71) Applicant: THE REGENTS OF THE UNIVERSITY OF MICHIGAN, Ann Arbor, MI (US)

(72) Inventors: Lingjie Jay Guo, Ann Arbor, MI (US); Taehee Jang, Ann Arbor, MI (US); Sangeon Lee, Ann Arbor, MI (US); Jinhwan Lee, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 37 days.

(21) Appl. No.: 16/067,044

(22) PCT Filed: Dec. 28, 2016

(86) PCT No.: PCT/US2016/068949
§ 371 (c)(1),
(2) Date: Jun. 28, 2018

(87) PCT Pub. No.: WO2017/117256
PCT Pub. Date: Jul. 6, 2017

(65) Prior Publication Data
US 2019/0019593 A1    Jan. 17, 2019

Related U.S. Application Data

(60) Provisional application No. 62/273,180, filed on Dec. 30, 2015.

(51) Int. Cl.
*H01B 1/02* (2006.01)
*H01L 51/00* (2006.01)
(Continued)

(52) U.S. Cl.
CPC .......... *H01B 1/02* (2013.01); *H01L 51/0023* (2013.01); *H01L 51/0097* (2013.01);
(Continued)

(58) Field of Classification Search
CPC ... H01B 1/02; H01L 51/0023; H01L 51/0097; H01L 51/442; H01L 51/5203;
(Continued)

(56) References Cited

U.S. PATENT DOCUMENTS 5,830,533 A * 11/1998 Lin ................ H05K 3/182
427/272
7,432,187 B1 * 10/2008 Cok ................ B82Y 20/00
257/E31.099

(Continued)

FOREIGN PATENT DOCUMENTS

WO   WO2011/106236     *  9/2011
WO   WO-2011106236 A2    9/2011

OTHER PUBLICATIONS

R. Yamamura et al., "Industrial High-Performance Liquid Chromatography Purification of Docosahexaenoic Acid Ethyl Ester and Docosapentaenoic Acid Ethyl Ester from Single-Cell Oil" *JAOCS*, vol. 74, No. 11 (1997).

(Continued)

*Primary Examiner* — Brian K Talbot
(74) *Attorney, Agent, or Firm* — Harness, Dickey & Pierce, P.L.C.

(57) ABSTRACT

Optically transparent, highly conductive conductor materials are provided, which in certain variations may also be flexible. Methods of making transparent conductive conductors, such as electrodes, are also provided. Such a method may include creating a groove pattern on a substrate that defines a two-dimensional array. Then an electrically conductive material may be selectively applied within the
(Continued)

Figures 1A, 1B, 1C, 1D, 1E, 1F, 1G:
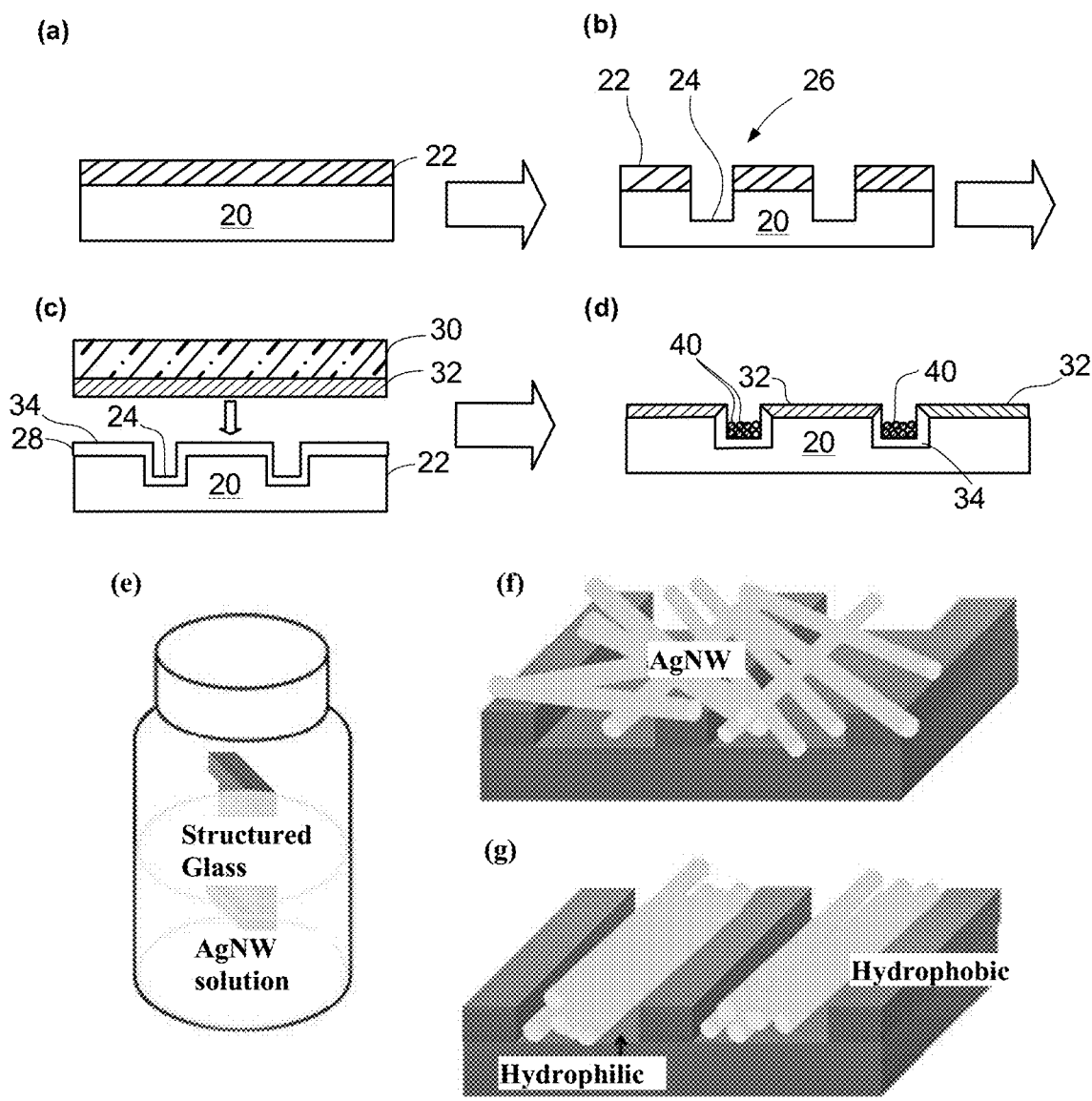

groove pattern of the substrate so as to create a transparent conductor (e.g., a transparent conductive electrode (TCE)). The transparent conductor has a sheet resistance of ≤about 5 Ohms/Square and a transmissivity of ≥about 50% for a predetermined range of target wavelengths of electromagnetic energy. Such methods may form linear micromesh conductive arrays and tortuous micromesh conductive arrays that can be used in a variety of optoelectronic applications, including as optically transparent, flexible and mechanically reconfigurable zeroth-order resonant (ZOR) antennas.

16 Claims, 13 Drawing Sheets

(51) Int. Cl.

| | |
|---|---|
| *H01L 51/44* | (2006.01) |
| *H01L 51/52* | (2006.01) |
| *H05K 3/02* | (2006.01) |
| *H05K 3/10* | (2006.01) |
| *H05K 3/12* | (2006.01) |
| *B05D 1/26* | (2006.01) |
| *H05K 3/42* | (2006.01) |
| *B05D 3/12* | (2006.01) |
| *B05D 5/12* | (2006.01) |
| *H05K 1/09* | (2006.01) |

(52) U.S. Cl.
CPC ........ *H01L 51/442* (2013.01); *H01L 51/5203* (2013.01); *H01L 51/5206* (2013.01); *H01L 51/5209* (2013.01); *B05D 1/26* (2013.01); *B05D 3/12* (2013.01); *B05D 5/12* (2013.01); *H01L 2251/5369* (2013.01); *H05K 1/09* (2013.01); *H05K 3/02* (2013.01); *H05K 3/10* (2013.01); *H05K 3/12* (2013.01); *H05K 3/42* (2013.01); *Y02E 10/549* (2013.01)

(58) Field of Classification Search
CPC ............. H01L 51/5206; H01L 51/5209; H01L 2251/5369; Y02E 10/549; B05D 1/26; B05D 3/12; B05D 5/12; H05K 1/09; H05K 3/02; H05K 3/10; H05K 3/12; H05K 3/42
USPC .......................................... 427/58, 97.7, 146
See application file for complete search history.

(56) References Cited

U.S. PATENT DOCUMENTS

| | | | |
|---|---|---|---|
| 8,034,402 B2* | 10/2011 | Namerikawa | C04B 35/63448 427/96.2 |
| 10,243,198 B2* | 3/2019 | Asai | G03F 7/40 |
| 2010/0203235 A1* | 8/2010 | Verschuuren | H01L 51/5212 427/66 |
| 2011/0240350 A1* | 10/2011 | Meinder | B82Y 10/00 174/258 |
| 2012/0292725 A1* | 11/2012 | Christoforo | H01L 31/022466 257/431 |
| 2013/0207911 A1* | 8/2013 | Barton | H01B 5/14 345/173 |
| 2015/0216057 A1* | 7/2015 | Park | H05K 3/207 174/255 |
| 2016/0192501 A1* | 6/2016 | Yan | H01L 29/413 29/846 |
| 2016/0345430 A1* | 11/2016 | Khan | C25D 5/54 |
| 2018/0323400 A1* | 11/2018 | Larson | H01L 51/0048 |

OTHER PUBLICATIONS

International Search Report and Written Opinion issued in PCT/US2016/068949, dated Apr. 12, 2017; ISA/KR.

T. Jang et al., "Semitransparent and Flexible Mechanically Reconfigurable Electrically Small Antennas Based on Tortuous Metallic Micromesh," in IEEE Transactions on Antennas and Propagation, vol. 65, No. 1, pp. 150-158, (Jan. 2017—Date of First Publication Nov. 11, 2016). doi: 10.1109/TAP.2016.2623479.

* cited by examiner (a)

(b)

TRANSPARENT AND FLEXIBLE CONDUCTORS MADE BY ADDITIVE PROCESSES

CROSS-REFERENCE TO RELATED APPLICATIONS

This application is a U.S. National Phase Application under 35 U.S.C. 371 of International Application No. PCT/US2016/068949 filed on Dec. 28, 2016 and published in English as WO 2017/117256 A1 on Jul. 6, 2017. This application claims the benefit and priority of U.S. Application Ser. No. 62/273,180 filed on Dec. 30, 2015. The entire disclosures of the above applications are incorporated herein by reference.

GOVERNMENT RIGHTS

This invention was made with government support under DMR1120187 and CMMI1025020 awarded by the National Science Foundation. The Government has certain rights in the invention.

FIELD

The present disclosure relates to transparent electrical conductors and methods for making the same.

BACKGROUND

Transparent conductive electrodes (TCEs) are a necessary component in many optoelectronic devices such as flat panel televisions, touch panels, smart phones, smart glass, solar cells, and organic light-emitting diodes (OLEDs). Indium tin oxide (ITO) is the most widely used material in commercial transparent electrodes; however, there are several attributes of ITO that are undesirable for the future TCEs. ITO is a ceramic, and is thus brittle and prone to cracking. Thus, alternative transparent conductors that are less brittle and have greater flexibility would be advantageous.

One promising alternative to ITO as a TCE includes random networks of Ag nanowires (AgNWs), which can provide lower sheet resistance (Rs) and higher optical transmittance (T) than other TCE candidates such as carbon nanotubes (CNTs), graphene, Cu NWs, and conducting polymers. Moreover, AgNW networks can be readily prepared by low-cost solution-based processes, such as doctor-blading, spin-coating, bar-coating, and spray-coating. However, for the use of random AgNW networks in high-performance solar cells and OLEDs, the junction resistance between nanowires and the large surface roughness are two issues that need to be addressed and that currently prohibit practical implementation.

Junction resistance prevents nanowire networks from achieving low Rs, while the high density of nanowires lowers the optical transmittance of the electrodes. The protruding nanowires from the overlapping random nanowire network can cause electrical shorts and leakages in multilayered device configurations, especially those involving thin films such as organic LEDs and solar cells. In addition, the optical haze (defined as the ratio of diffusive transmittance to total transmittance) of random nanowire networks may blur pixels or reduce the resolution in touch-screen and OLED devices. To address the issue of junction resistance between nanowires, several approaches including thermal annealing, mechanical pressing, combination with metal oxides and carbon materials, and plasmonic-welding have been explored. The surface roughness issue has been addressed by the addition of coatings and laminations with polymers, metal oxides, and graphene sheets. However, these additional processes complicate the fabrication process or are incompatible with low-cost and large-scale solution processing.

Additionally, antennas made of transparent conductors for wearable applications are needed that can be stretched, folded, and twisted. Many conventional flexible antennas, which are fabricated on a flexible copper-clad laminate, have been researched. One challenge with using a flexible substrate is that the mechanical stability of the metal pattern and rigidity of the substrate are not sufficient for wearable gadgets. Thus, it would be desirable to find methods of making new transparent conductors having enhanced flexibility and reduced brittleness, while avoiding many of the technical issues that have arisen with nanowire-based and other conventional technologies.

SUMMARY

This section provides a general summary of the disclosure, and is not a comprehensive disclosure of its full scope or all of its features.

In various aspects, the present disclosure relates to methods for making transparent conductors. In certain variations, the disclosure provides a method of making a transparent conductor that comprises creating a groove pattern on a substrate that defines a two-dimensional array. Then, an electrically conductive material is selectively applied within the groove pattern of the substrate so as to create the transparent conductor. The transparent conductor may have a sheet resistance of less than or equal to about 5 Ohms/Square and a transmissivity of greater than or equal to about 50% for a predetermined range of target wavelengths of electromagnetic energy. Transparent conductive electrodes formed by such a method are also provided.

In other aspects, the present disclosure provides a method of making a transparent conductor. The method may include filling a plurality of grooves that defines a two-dimensional array on a surface of a substrate with a liquid material. The liquid material comprises a plurality of electrically conductive axial particles and a liquid carrier. In variations where the liquid carrier is aqueous, the surfaces of the plurality of grooves are made hydrophilic and regions external to the plurality of grooves on the surface of the substrate are hydrophobic. The method further comprises removing any excess electrically conductive axial particles from regions of the surface of the substrate external to the grooves. The liquid carrier is then removed to form electrically conductive structures comprising the electrically conductive axial particles in the two-dimensional array creating the transparent conductor. The electrically conductive axial particles may thus be substantially aligned. The transparent conductor has a sheet resistance of less than or equal to about 5 Ohms/Square and a transmissivity of greater than or equal to about 50% for a predetermined range of target wavelengths of electromagnetic energy. Transparent conductive electrodes formed by such a method are also provided.

In yet other aspects, the present disclosure provides a method of making a transparent conductor comprising applying an electrically conductive initiator layer over a surface of the substrate. A mask is then created over the electrically conductive initiator layer that defines a groove pattern. The method further comprises selectively applying an electrically conductive material within the groove pattern. The mask may be removed from the substrate to form a transparent conductor having a two-dimensional array of the electrically conductive material. The transparent conductor has a sheet resistance of less than or equal to about 5 Ohms/Square and a transmissivity of greater than or equal to about 50% for a predetermined range of target wavelengths of electromagnetic energy. Transparent conductive electrodes formed by such a method are also provided.

In further aspects, the present disclosure provides a method of making a flexible transparent conductor. The method may include creating a groove pattern on a substrate that defines a two-dimensional array. The method further comprises selectively applying an electrically conductive material within the groove, pattern of the substrate. Then, an elastomeric material is applied over the substrate after the selectively applying of the electrically conductive material. The elastomeric material may be removed from the substrate. The elastomeric material comprises the electrically conductive material embedded in the elastomeric material in the groove pattern, so as to create a flexible transparent conductor. The flexible transparent conductor thus formed has a sheet resistance of less than or equal to about 5 Ohms/Square and a transmissivity of greater than or equal to about 50% for a predetermined range of target wavelengths of electromagnetic energy. When the flexible transparent conductor is stretched by 20%, an electrical conductivity of the flexible transparent conductor is reduced by less than or equal to about 5% as compared to a comparative conductivity when the flexible transparent conductor is not stretched. Transparent flexible conductors formed by such a method are also provided.

In still further aspects, the present disclosure provides a method of making a flexible transparent conductor that comprises creating a groove pattern comprising a plurality of grooves on a substrate that defines a two-dimensional array by using a radiation sensitive resist material. The method may further comprise selectively applying an initiator layer within the plurality of grooves via an electroless deposition process. Then, an electrically conductive material may be selectively applied over the initiator layer within the plurality of grooves via an electroless deposition process to form the transparent conductor. The transparent conductor has a two-dimensional array of the electrically conductive material, a sheet resistance of less than or equal to about 5 Ohms/Square, and a transmissivity of greater than or equal to about 50% for a predetermined range of target wavelengths of electromagnetic energy.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-1G. FIGS. 1A-1E and 1G show a method for making a transparent conductor, such as a transparent conductive electrode, in accordance with certain aspects of the present disclosure. FIG. 1A shows a cross-sectional schematic illustration of a glass substrate having a photoresist patterned thereon to be dry etched to form a plurality of grooves therein. FIG. 1B shows a cross-section of an etched surface of the substrate having a groove pattern defining a plurality of linear grooves and lands distributed between the grooves. FIG. 1C shows a cross-section of the substrate having the groove pattern after the photoresist has been removed and after an RCA cleaning process on the surface of the substrate after to render the surface hydrophilic. An elastomeric (e.g., polydimethylsiloxane) stamp is used in a transfer printing process technique to apply a hydrophobic layer (e.g., octadecyltrichlorosilane (OTS)) to the surface lands, while the grooves remain hydrophilic. FIG. 1D shows a cross-sectional view of the substrate after immersion in the liquid material, where a plurality of silver nanowires is disposed in the grooves of the groove patterned and is substantially aligned along the groove axis. FIG. 1E shows the substrate being immersed in a liquid material comprising a plurality of electrically conductive axial geometry particles, such as silver nanowires. FIG. 1F is a cross-sectional schematic of a comparative system, where the surface is untreated (lacking any hydrophilic and hydrophobic domains), and after immersion in the liquid material, the axial geometry silver nanowires are randomly distributed. FIG. 1G shows a cross-sectional schematic of a substrate prepared as described in FIGS. 1A-1C, where the axial geometry silver nanowires are advantageously aligned within the hydrophilic domains corresponding to the grooves along the groove axis (also as shown in FIG. 1D).

Figures 2A, 2B:
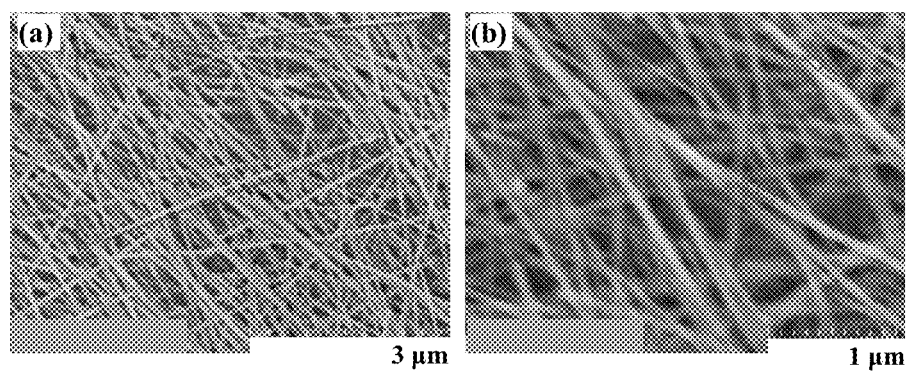

FIGS. 2A-2B. FIGS. 2A-2B show SEM images of short silver nanowires (AgNWs—having a length of about 5 μm and a diameter of about 50 nm) that are suitable for use in accordance with certain methods of the present disclosure. FIG. 2A has a scale bar of 3 μm and FIG. 2B has a scale bar of 1 μm.

Figure 3A:
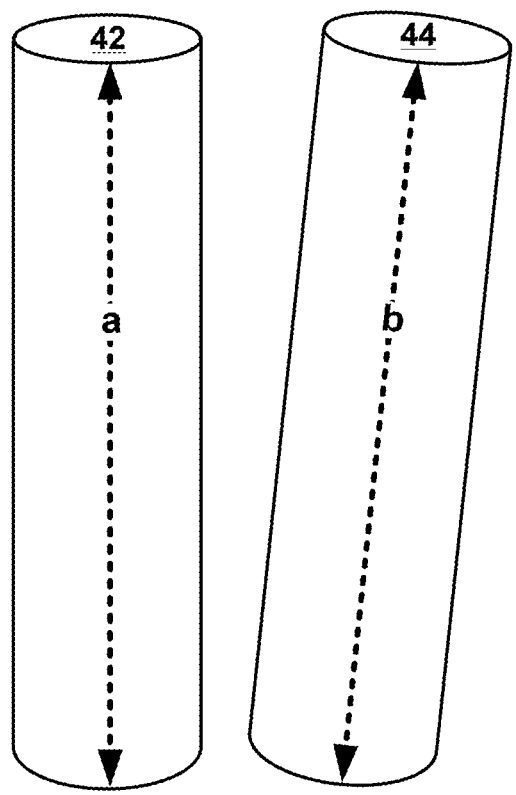
Figure 3B:
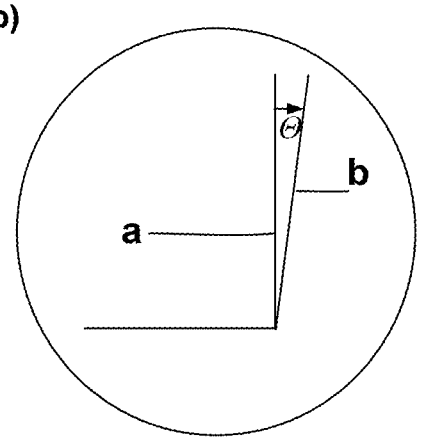

FIGS. 3A-3B. FIG. 3A shows a schematic illustration of two axial geometry nanoparticles relative to one another. FIG. 3B shows a schematic of the angle of offset between the two axial geometry nanoparticles in FIG. 3A.

Figures 4A, 4B:
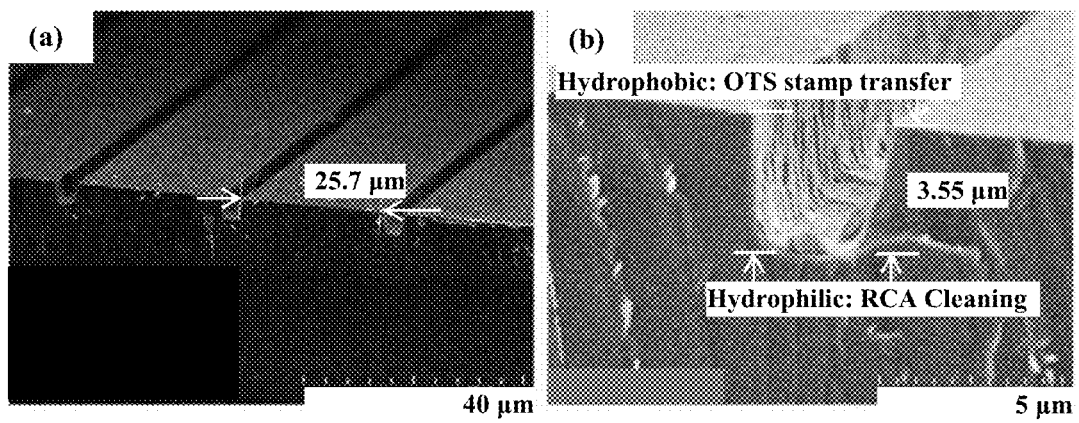

FIGS. 4A-4B. FIGS. 4A-4B are SEM images of a patterned glass substrate prepared in accordance with certain aspects of the present disclosure. FIG. 4A shows a glass substrate dry etched to have a plurality of grooves in a pattern. Scale of 40 μm. FIG. 4B shows the upper land regions having a hydrophobic layer, whereas the grooves in the lower regions have a hydrophilic layer of the patterned glass substrate. Scale of 5 μm.

Figures 5A, 5B, 5C, 5D:
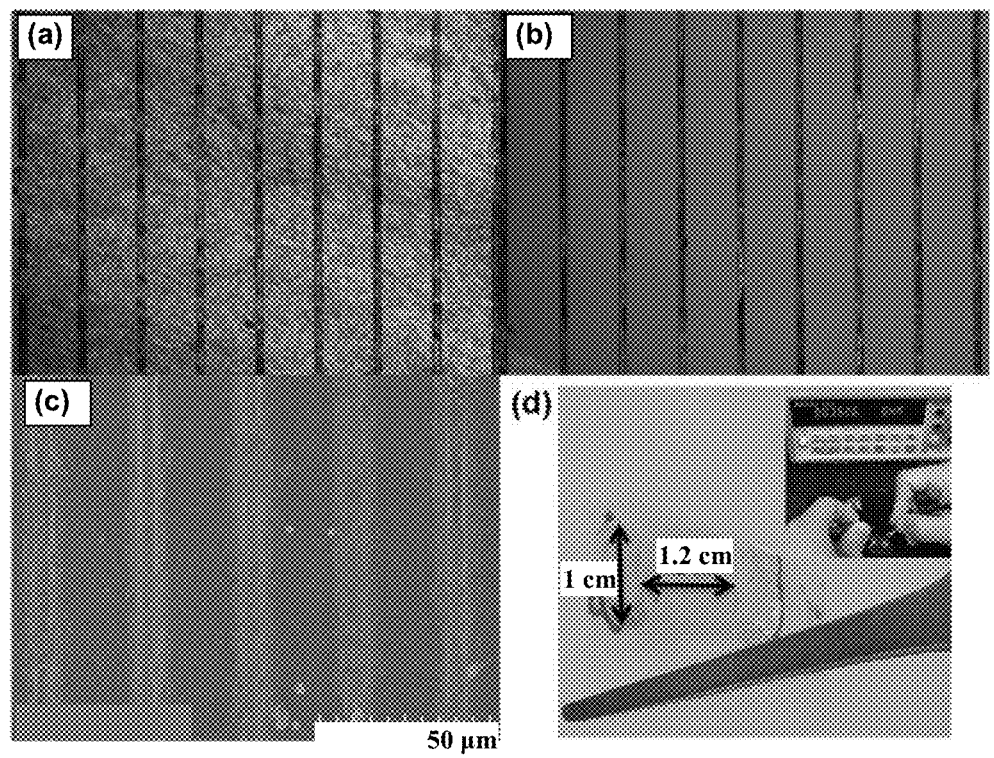

FIGS. 5A-5D. FIGS. 5A-5C show optical microscopic images of AgNWs distribution on a patterned glass substrate. In FIG. 5A, the substrate is shown before stamp printing with a hydrophobic OTS material. FIG. 5B shows the substrate after stamp printing with the hydrophobic OTS material. FIG. 5C is an SEM image of patterned AgNWs on the glass substrate. FIG. 5D is a photograph showing a 3.5Ω reby multi meter test of a substrate having AgNWs patterned like in FIG. 5C.

Figure 6:
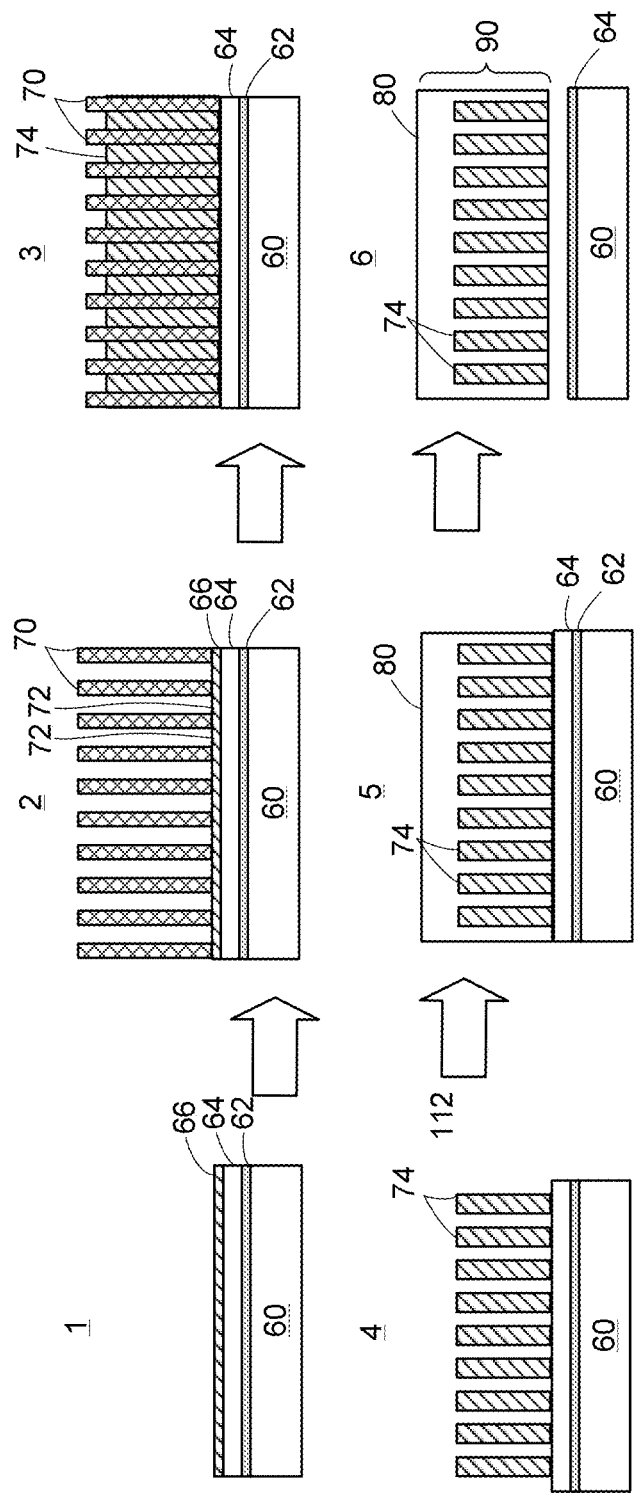

FIG. 6 shows a schematic of a method for making a transparent conductive electrode as a micromesh in accordance with certain aspects of the present disclosure.

Figure 7A:
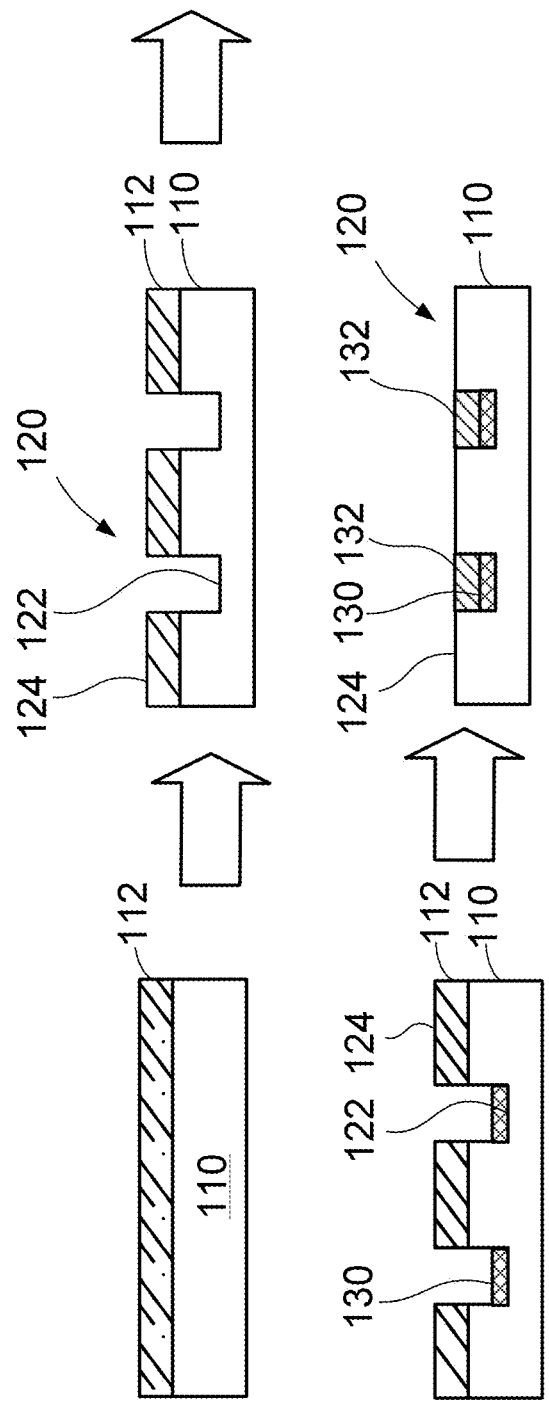
Figures 7B, 7C, 7D:
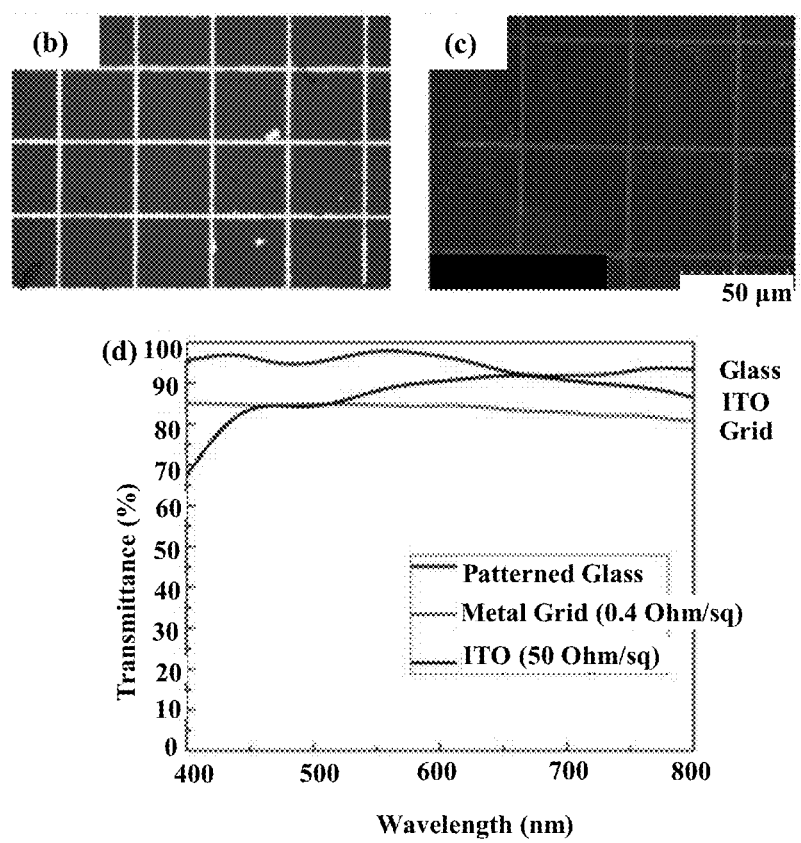

FIGS. 7A-7D. FIG. 7A shows a schematic of another method for making a transparent conductive electrode having a conductive mesh via a two-stage electroless deposition process in accordance with certain aspects of the present disclosure. FIGS. 7B and 7C show an optical image and scanning, electron microscope image of a sample fabricated by an exemplary electroless deposition process. The scale in FIG. 7C is 50 μm. FIG. 7D shows transmittance of a transparent conductor formed by such an exemplary electroless deposition process.

Figures 8A, 8B, 8C, 8D, 8E, 8F, 8G:
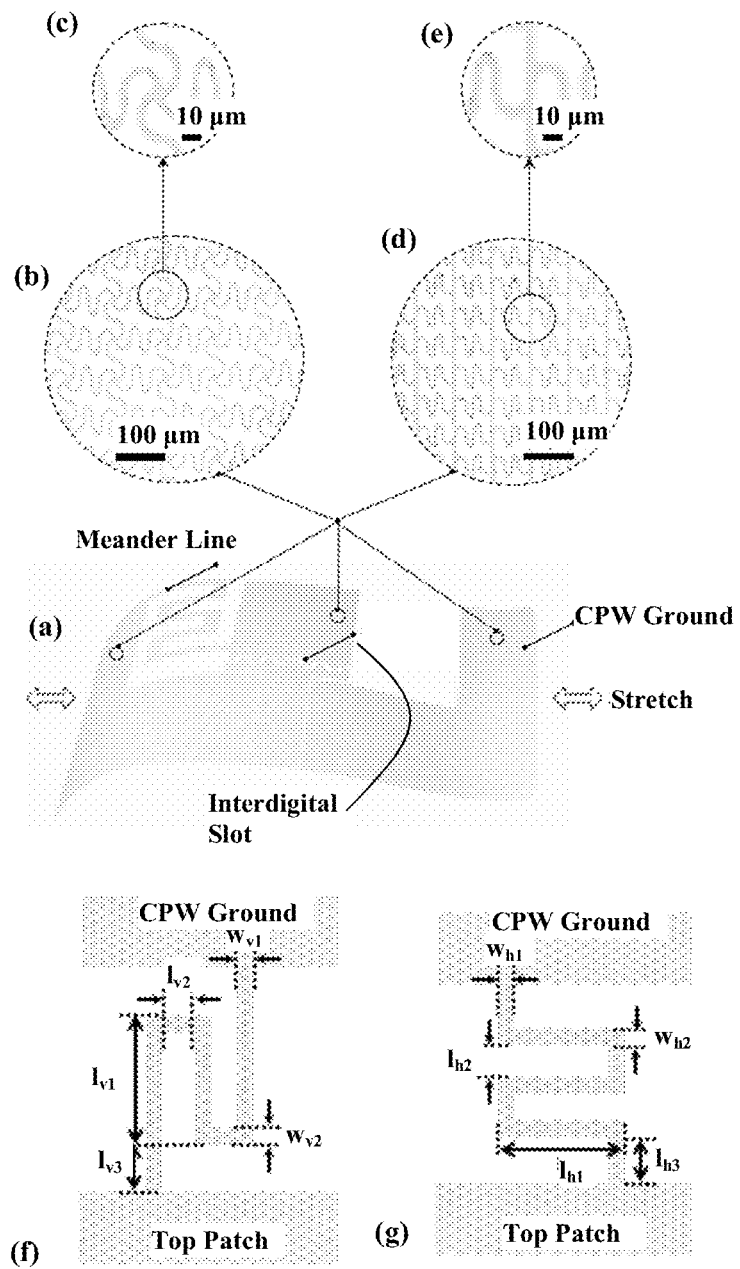

FIGS. 8A-8G. FIG. 8A shows a schematic of exemplary configurations of transparent and mechanically reconfigurable antennas. FIGS. 8B-8C show a first type of transparent tortuous micromesh formed in accordance with certain principles of the present disclosure, while FIGS. 8D-8E show a second type of transparent tortuous micromesh formed in accordance with certain other principles of the present disclosure. FIG. 8F shows a vertical-oriented meander line ($w_{v1}=w_{v2}=0.3$ mm, $l_{v1}=2.52$ mm, $l_{v2}=0.58$ mm, $l_{v3}=1$ mm) antenna. FIG. 8G shows a horizontal-oriented meander line ($w_{h1}=w_{h2}=0.3$ mm, $l_{h1}=2.52$ mm, $l_{h2}=0.58$ mm, $l_{v3}=1$ mm) antenna.

Figures 9A, 9B, 9C:
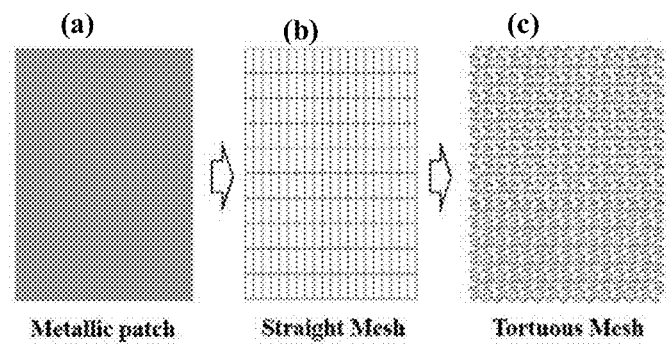

FIGS. 9A-9C. FIGS. 9A-9C show schematics of topology modification for an antenna component. FIG. 9A shows a conventional solid metallic patch. FIG. 9B shows a straight transparent and stretchable micromesh formed in accordance with certain principles of the present disclosure. FIG. 9C shows a tortuous transparent and stretchable micromesh formed in accordance with certain other principles of the present disclosure.

Figures 10A, 10B, 10C, 10D, 10E, 10F:
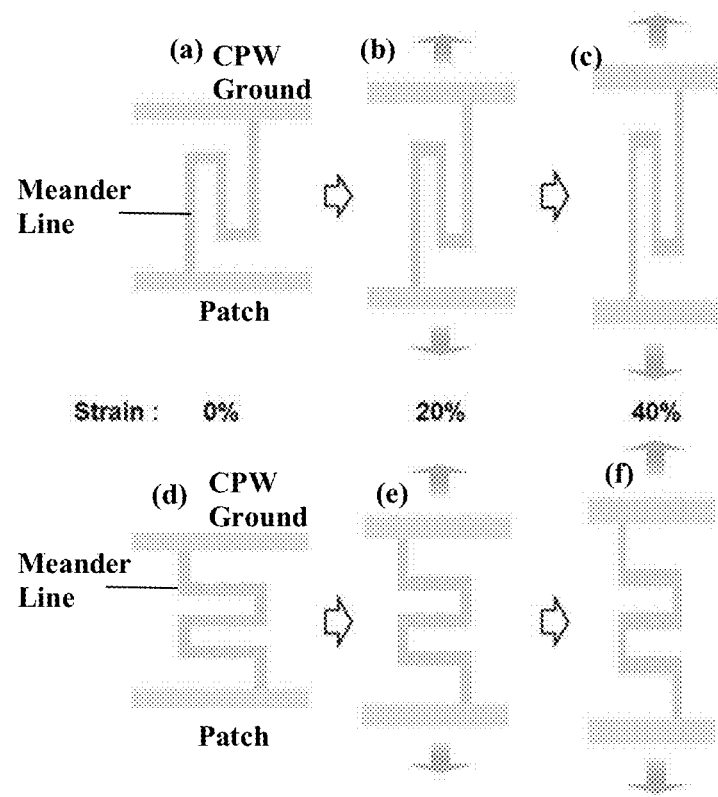

FIGS. 10A-10F. FIGS. 10A-10F show the change of vertical-oriented and horizontal-oriented meander lines with different tensile strains. FIGS. 10A-10C show a vertical-oriented meander line at 0% strain (FIG. 10A), 20% strain (FIG. 10B), and 40% strain (FIG. 10C). FIGS. 10D-10F show a horizontal-oriented meander line at 0% strain (FIG. 10D), 20% strain (FIG. 10E), and 40% strain (FIG. 10F).

Figures 11A, 11B, 11C:
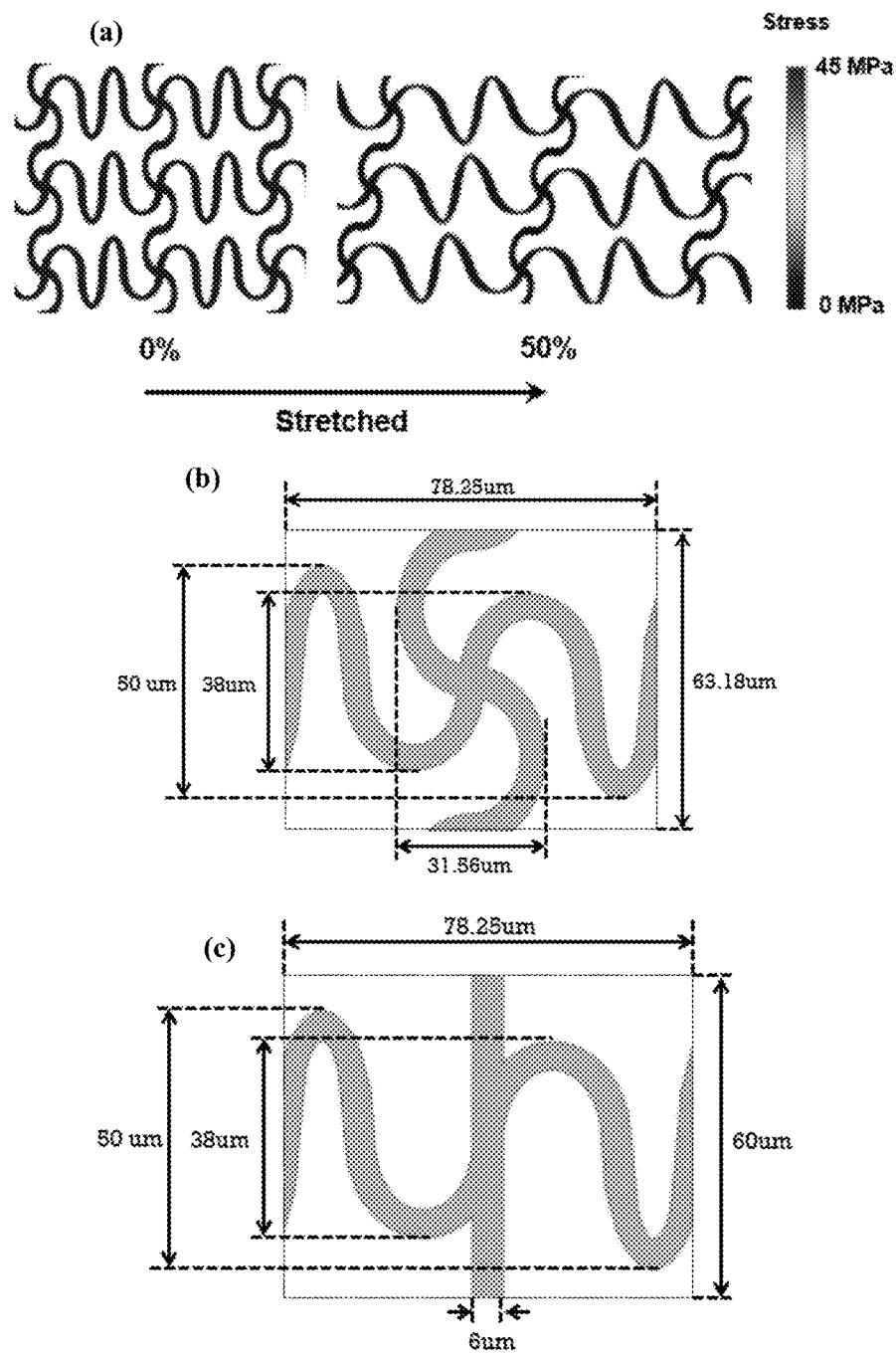

FIGS. 11A-11C. FIG. 11A shows mechanical simulation of a tortuous transparent and stretchable micromesh formed in accordance with certain principles of the present disclosure. FIG. 11B is a unit cell of one embodiment of a stretchable conductive tortuous micromesh using both tortuous wires in horizontal and longitudinal direction. FIG. 11C is a unit cell of another embodiment of a tortuous micromesh using tortuous wire in a horizontal direction and straight wire in a longitudinal direction.

Figure 12:
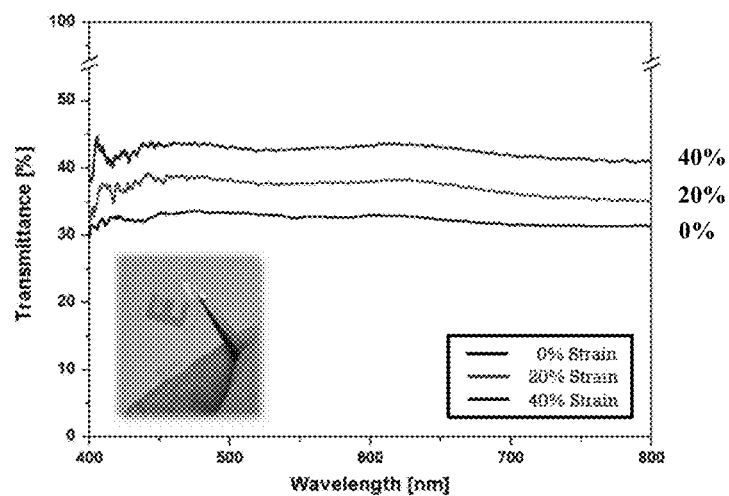

FIG. 12. FIG. 12 shows measured optical transmission for a stretchable antenna prepared in accordance with certain aspects of the present disclosure, including a conductive copper mesh embedded in a polydimethylsiloxane (PDMS) elastomer. The antenna is measured at 0% strain, 20% strain, and 40% strain.

Figures 13A, 13B:
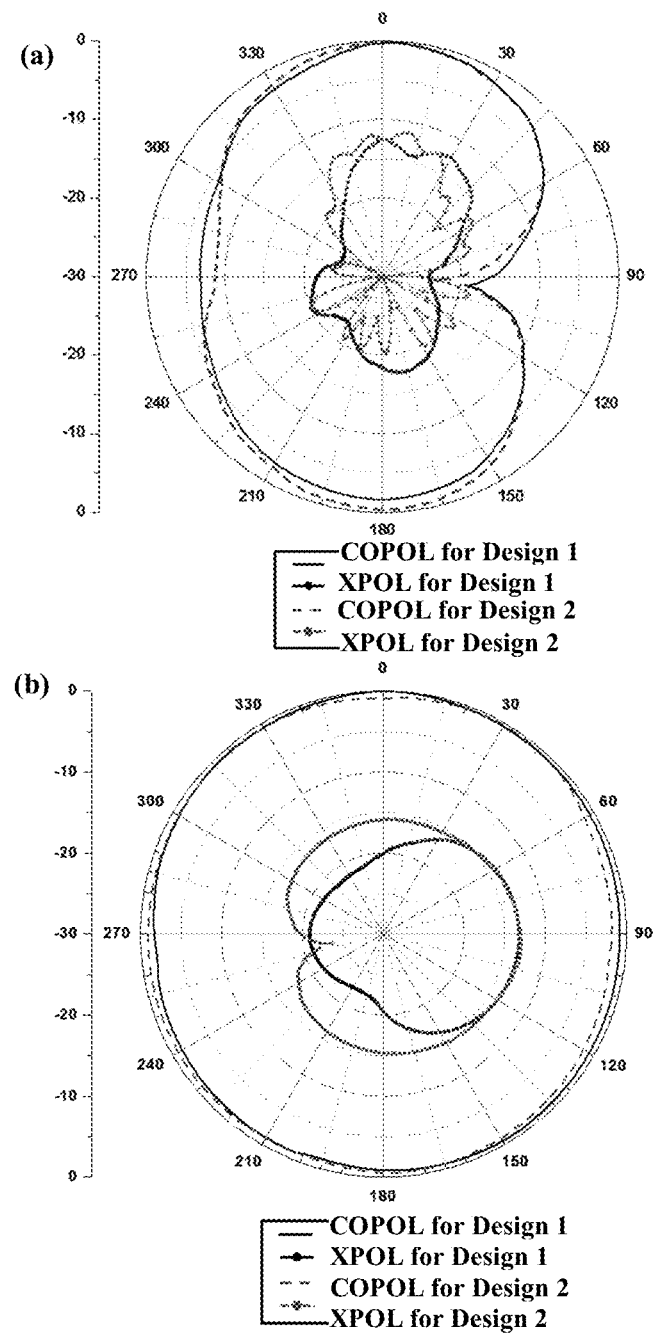

FIGS. 13A-13B. FIGS. 13A and 13B show the measured radiation patterns on the xz-plane (E-plane) and yz-plane (H-plane) at 2.92 GHz for stretchable conductive tortuous micromesh designs shown in FIGS. 11B (Design 1) and 11C (Design 2), respectively.

Figure 14:
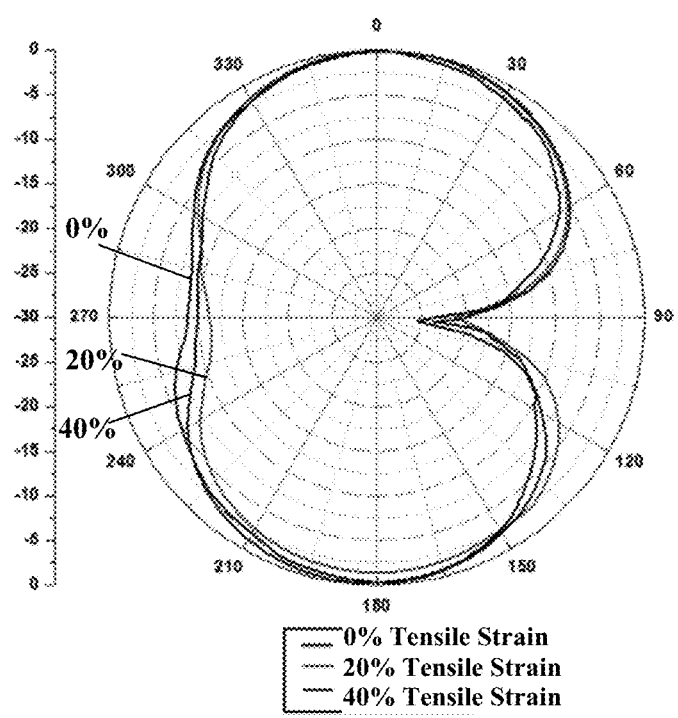

FIG. 14 shows measured radiation patterns in response to the increase of the tensile strain (0%, 20%, and 40% tensile strain) for exemplary stretchable antennas prepared in accordance with certain aspects of the present disclosure.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. Further, the present disclosure contemplates that any particular feature or embodiment can be combined with any other feature or embodiment described herein. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise.

The terms "comprises," "comprising," "including," and "having," are inclusive and therefore specify the presence of stated features, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

As referred to herein, the word "substantially," when applied to a characteristic of a composition or method of this disclosure, indicates that there may be variation in the characteristic without having a substantial effect on the chemical or physical attributes of the composition or method.

As used herein, the term "about," when applied to the value for a parameter of a composition or method of this disclosure, indicates that the calculation or the measurement of the value allows some slight imprecision without having a substantial effect on the chemical or physical attributes of the composition or method. If, for some reason, the imprecision provided by "about" is not otherwise understood in the art with this ordinary meaning, then "about" as used herein indicates a possible variation of up to 5% in the value.

When an element or layer is referred to as being "on," "contacting," "engaged to," "connected to," or "coupled to" another element or layer, it may be directly on, engaged, contacting, connected, or coupled to the other element or layer, or intervening elements or layers may be present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, and the like may be used herein to describe various components, moieties, elements, regions, layers and/or sections, these components, moieties, elements, regions, layers and/or sections are not exclusive and should not be limited by these terms. These terms may be only used to distinguish one component, moiety, element, region, layer or section from another component, moiety, element, region, layer or section. Terms such as "first," "second," and other numerical terms when used herein do not imply a sequence or order unless clearly indicated by the context. Thus, a first component, moiety, element, region, layer or section discussed below could be termed a second component, moiety, element, region, layer, or section without departing from the teachings of the example embodiments.

Spatially relative terms, such as "bottom," "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments will now be described more fully with reference to the accompanying drawings.

Transparent conductors are important components for many optoelectronic devices and platforms. Indium tin oxide (ITO) has been the material of choice as a transparent conductor in the industries of display, organic optoelectronics, and GaN LEDs. Another important application is in in touch panels, which will likely become the universal interface platform for much of the human-computing/mobile devices. As noted above, the most commonly used transparent conductor, indium tin oxide (ITO), suffers from poor mechanical flexibility and insufficient conductance for large-area devices, as well as rising costs due to limited indium supplies and the increasing demand for displays and related electronics market. However, practical, robust alternatives to ITO have significant shortcomings thus, new transparent highly conductive electrodes are needed that are more robust and flexible for such applications.

The transparent conductors, such as transparent conductive electrodes, made in accordance with the present disclosure are transparent, have high electrical conductivity. The transparent conductors may also be flexible; thus, having greater durability for use in a variety of applications that would not otherwise be possible for ITOs. The present disclosure provides in various aspects methods of making such transparent conductors. Such a method in certain aspects may include creating a groove pattern on a substrate. As described further below, the groove pattern may be formed in the substrate by etching or other lithographic techniques. The groove pattern defines a two-dimensional array. Then, an electrically conductive material may be selectively applied within the groove pattern of the substrate so as to create the transparent conductor. The electrically conductive material may include a material selected from the group consisting of: silver, gold, nickel, copper, chromium, aluminum, zinc, alloys thereof, graphene, graphene oxide, and combinations thereof. In certain preferred variations, the electrically conductive material may include a material selected from the group consisting of: silver, gold, copper, nickel, chromium, alloys, and combinations thereof. In various aspects, the transparent conductor thus formed has a sheet resistance of less than or equal to about 5 Ohms/Square and a transmissivity of greater than or equal to about 50% for a predetermined range of target wavelengths of electromagnetic energy.

Such transparent conductors should be transparent or semi-transparent in addition to exhibiting good electrical conductivity. By transparent, it is meant that the electrically conductive thin film is transmissive for a target range of wavelengths of electromagnetic energy, for example, in the visible and ultraviolet wavelength ranges. In certain variations, the transparent conductor structures of the present disclosure are capable of transmitting select portions of the electromagnetic spectrum and thus are transparent or semi-transparent. Transparency may generally encompass semi-transparency, and can be understood generally to mean that greater than or equal to about 40% of a predetermined target wavelength or range of wavelengths (which may be polarized or non-polarized) of light/energy pass through the conductor structures. In certain variations, greater than or equal to about 50% of a target wavelength (or range of wavelengths) passes through the transparent conductor, optionally greater than or equal to about 60%, optionally greater than or equal to about 70%, optionally greater than or equal to about 75%, optionally greater than or equal to about 80%, optionally greater than or equal to about 85%, optionally greater than or equal to about 90%, optionally greater than or equal to about 95%, and in certain variations, optionally greater than or equal to about 97% of target wavelength(s) pass through the transparent conductors of the present disclosure.

Accordingly, the transparent conductors desirably permit a range of predetermined wavelengths to pass, such as electromagnetic radiation in the visible or near-infrared (near-IR) ranges. Particularly suitable visible and infrared electromagnetic radiation includes, visible light having wavelengths ranging from about 390 to about 750 nm and infrared radiation (IR) (including near infrared (NIR) ranging from about 0.75 to about 1.4 µm). Filtered electromagnetic radiation can have a wavelength in a range of about 625 nm to 740 nm for red; orange is at about 590 nm to about 625 nm; yellow is at about 565 nm to about 590 nm; green is at about 520 nm to about 565 nm; blue or cyan is at about 500 nm to about 520 nm; blue or indigo is at about 435 nm to about 500 nm; and violet is at about 380 nm to about 435 nm. Further, in certain aspects, the filtered light may be extra-spectral or a mixture of several different wavelengths. For example, magenta is an extra-spectral mixture of red (625 nm to 740 nm) and blue (435 nm to 500 nm) wavelengths.

The transparent conductors formed according to certain aspects of the present disclosure have high levels of electrical conductivity, which is represented by having low sheet resistance values. For example, the transparent conductor may have a sheet resistance of less than or equal to about 5 Ohms/Square, optionally less than or equal to about 1 Ohm/Square, optionally less than or equal to about 0.75 Ohm/Square, optionally less than or equal to about 0.5 Ohm/Square, optionally less than or equal to about 0.25 Ohm/Square, and in certain variations, optionally less than or equal to about 0.1 Ohm/Square.

In various aspects, the transparent conductive materials of the present disclosure may be used as electrodes in a variety of optical and photonic applications. For example, the transparent conductors may replace current transparent conductors, like indium tin oxide (ITO), in a variety of applications. The transparent conductor may be used as a transparent electrode. The transparent conductors may be used as components in antennas, light emitting devices, like diodes (LEDs) including organic LEDs and gallium nitride LEDs, photovoltaic cells, including organic photovoltaic cells, flat panel displays, liquid crystal displays (LCD), protection displays (such as using digital mirror technology, or liquid crystal on silicon (LCoS), touch screens, eye-wear displays, a transparent or see-through display, windows or displays, smart switchable windows or other devices, for example, those using electrochromic or phase change materials, complementary metal-oxide-semiconductor (CMOS) image sensors, IR imagers or IR shields, by way of non-limiting example.

The methods in certain variations of the present disclosure may include creating the groove pattern by forming a plurality of linear grooves in a substrate. A groove is a two-dimensional trough or void formed in the substrate. A two-dimensional array is created by an arrangement of at least two grooves formed in the substrate. By linear grooves, it is meant that each groove follows a line or linear path, for example, being linear in two dimensions. Such linear grooves may be arranged in parallel to one another and spaced apart at regular intervals to create rows. However, the linear grooves may be formed so that one linear groove intersects another linear groove at an angle. For example, where a first set of parallel linear grooves has a first orientation, a second set of parallel linear grooves may have a second orientation offset from the first set by a given angle (e.g., 90° where the first set and second set of parallel linear grooves are perpendicular to one another). Where the first set and second set of parallel linear grooves are perpendicular to one another, they intersect and define a two-dimensional array of columns and rows in the form of a straight mesh pattern, such as that shown in FIG. 8B. Of course, more than two sets of linear parallel grooves may be formed in the substrate and the angle of offset between them where they intersect may be an angle other than 90°.

In other variations, the methods may include creating a groove pattern that comprises forming curved or tortuous grooves. Such tortuous grooves are non-linear (e.g., not straight) in at least two dimensions, so that they may be curved, spiral, such as telephone cord shapes, undulating, serpentine, or having other regular changes in direction. Like the linear grooves, tortuous grooves may be arranged in parallel to one another or at an angle to one another and be spaced apart at regular intervals. When the grooves are tortuous, they may define a two-dimensional array in the form of a tortuous mesh having a regular pattern. For example, a first set of parallel tortuous grooves and a second set of parallel tortuous grooves may be arranged perpendicular to one another, so that the first set intersects the second set to form a tortuous mesh pattern, such as that shown in FIGS. 8B-8D, 9C, and 10B-10C, for example. As will be discussed further herein, such tortuous mesh shapes are particularly suitable for creating stretchable conductive structures.

A period between a pair of parallel rows or groove features formed of conductive material determines periodicity of the openings or slits in the two-dimensional array structure, which relates to a wavelength (or range of wavelengths) that are transmitted by the device. A ratio of spacing of openings between the respective grooves in the array structure determines the transparency, as the metallic features will typically block transmission of the light. Thus, the spacing or distance between adjacent metal rows/structures determines a range of wavelengths that are transmitted through the transparent conductor. In certain variations for the visible light band, if the width of each groove feature is about 2 micrometers ($\mu$m), a periodicity or distance between adjacent groove features in the two-dimensional array may be less than or equal to about 200 $\mu$m, optionally less than or equal to about 100 $\mu$m, optionally less than or equal to about 50 $\mu$m, optionally less than or equal to about 25 $\mu$m, optionally less than or equal to about 10 $\mu$m, optionally less than or equal to about 1 $\mu$m in certain variations, depending on the desired level of transparency and conductivity.

In certain variations, the methods of the present disclosure may provide a combination of wet-chemistry approaches (a combination of surface patterning followed by dip-coating) that can be used to produce large numbers of axial geometry particles, such as conductive nanowires, assembled in vertically ordered, robust arrays on the patterned glass surfaces. For example, after creating the groove pattern, the method may further comprise treating a surface of the substrate including the groove pattern to be hydrophilic and then treating regions of the surface of the substrate external to or excluding the grooves to be hydrophobic. Such a process facilitates high levels of alignment of the electrically conductive materials when they are in the form of axial geometry particles, as will be described in more detail herein.

FIGS. 1A-1E and 1G show a method for making transparent conductors, such as a transparent conductive electrode, in accordance with certain aspects of the present disclosure. FIG. 1A shows a schematic illustration of a substrate 20 that will have a groove pattern is formed therein. Such a groove pattern is formed via a photolithographic technique or a nanoimprint lithographic technique that enables micro-patterning or nano-patterning. The substrate 20 may be any material known to those of skill in the art, such as a glass-based or polymeric substrate. For example, a suitable substrate 20 optionally comprises glass, silicon dioxide, silicon, any metallic substrate, such as a thin metal plate or a metal foil, a surfactant-modified metal foil, metalized plastic, conductive oxides, such as indium tin oxide (ITO) or fluorine-doped indium tin oxide (FTO), polymers, like polyethylene terephthalate (PET), polyethylene naphthalate or (poly(ethylene 2,6-naphthalate) (PEN), siloxane, polycarbonate, and the like, by way of non-limiting example are contemplated. In certain variations, the substrate 20 may form part of the transparent conductor device, while in other variations, the transparent conductor is removed from the substrate after the fabrication process. Thus, the substrate 20 may be a conductive substrate formed of a transparent conductive material like ITO which may remain or be removed after the formation process or a metal foil or surfactant-modified metal foil, which may optionally be removed after fabrication of the transparent conductor. The glass substrates (Corning® microscope slides) may be prepared in a conventional matter, for example, being cut to desired shape and dimensions (e.g., rectangular pieces of approximately 2.5 cm×2.5 cm) followed by cleaning.

A radiation sensitive photoresist material 22, such as a positive photoresist material, is disposed on the surface of the substrate 20. One suitable positive photoresist material 22 is commercially available from Dow as MEGAPOSIT SPR™ 220-3.0. The photoresist material 22 may have a thickness, for example, of about 2 micrometers, by way of non-limiting example. Radiation or an electronic beam energy (e-beam) is selectively applied to one or more preselected regions of the photoresist material 22 to create a precursor of the groove pattern on the surface of the substrate 20. The photoresist may be first heated, for example, at 115° C. for 1 minute. The positive resist material 22 is then exposed to radiation or e-beam energy in the preselected regions. The resist material 22 may then be removed by a developer and unexposed regions outside the preselected regions remain intact in the presence of the developer. A Mask Aligner or a stepper can be used for photolithographically patterning groove grating patterns in the photoresist material 22. Thus, the method further comprises exposing the substrate 20 to the developer to remove the one or more preselected regions of the radiation-exposed sensitive positive resist material 22, so that the underlying substrate material may be etched to create a plurality of grooves 24 that define a groove pattern 26 in the one or more preselected regions of the substrate 20, as shown in FIG. 1B. For example, a dry etching process on the substrate (e.g., glass) may then be conducted to create the grooves 24 in regions where the photoresist material 22 has been removed. In certain variations, a depth of the grooves 24 formed may be greater than or equal to about 1 $\mu$m, optionally greater than or equal to about 2 $\mu$m, and in certain aspects, optionally greater than or equal to about 3 $\mu$m. In one variation, the etching may be performed by a glass etcher with $C_4F_8$/He gas mixture for 15 minutes to form the grooves 24, as shown in FIG. 1B.

After forming the grooves 24 in the resist material 22 and the substrate 20, the patterned surface of the substrate 20 can be further treated to render it hydrophilic, thus defining a hydrophilic surface 28. For example, the surface of the substrate 20 can be subjected to a RCA cleaning process after the photoresist material 22 has been removed after forming the grooves 24 (not shown) to render the surface hydrophilic. The substrate 20 may be cleaned, for example, by being immersed in deionized (DI) water in an ultrasonic bath for about 10 minutes. Then, the substrate may be immersed in a RCA cleaning process to form hydrophilic surface 28. The RCA cleaning method is comprised of two major steps (i) removal of organic materials with ammonium hydroxide ($NH_4OH$), hydrogen peroxide ($H_2O_2$), and DI water (5:1:1) at 75° C. for 10 minutes followed by (ii) removal of ionic and remaining contaminants with hydrochloric acid (HCl), $H_2O_2$, and DI water (5:1:1) for at 75° C. for 10 minutes, followed by rinsing several times with DI water. After rinsing, the substrate 20 may be dried under a stream of nitrogen and stored in sealed containers.

FIG. 1C shows an elastomeric stamp 30 used in a transfer printing process technique to selectively apply a hydrophobic material 32 to the surface of the substrate 20 in regions external to the grooves 24 (e.g., applying a hydrophobic material 32 to lands 34 on the substrate 20 surface). It should be noted that this embodiment is used where the liquid material comprises an aqueous carrier, so that the hydrophobic material 32 repels the liquid material. In alternative variations (e.g., where the liquid carrier is non-aqueous or non-polar), the opposite approach may be used where the grooves 24 may be treated to be oleophilic car hydrophobic, while the lands 34 are oleophobic or hydrophilic. The elastomeric stamp 30 may be a polydimethylsiloxane (PDMS) elastomeric stamp. As shown, the elastomeric stamp 30 has a flat or planar surface. A polydimethylsiloxane (PDMS) (Dow Chemical) stamp may be formed by curing at 60° C. for 2 hours in a vacuum oven.

For surface patterning, the hydrophobic material 32 may comprise an octadecyltrichlorosilane (OTS) (Sigma-Aldrich) toluene solution used as ink during the application process. For the preparation of OTS patterned SAMs, the polydimethylsiloxane (PDMS) elastomeric stamp 30 may be immersed into 0.5 vol. % OTS solution in toluene (ink) and then brought in contact with the cleaned glass substrate 20 for 30 seconds under ambient conditions. The printing/stamping process may be repeated to form multiple layers of hydrophobic material 32. After each printing, the elastomeric stamp 30 may be sonicated in toluene and ethanol for 2 minutes and then dried with a stream of nitrogen for 1 minute to remove excess materials.

FIG. 1E shows the substrate having the treated groove pattern 26 being immersed in a liquid material comprising a plurality of electrically conductive axial geometry particles, such as silver nanowires. As noted above, the process may include treating the surface of the patterned substrate to introduce surface energy differences between top surfaces or lands and the patterned grooves, which will facilitate the axial particles being selectively disposed and aligned in the grooves. Axial geometry particles are anisotropic and have a cylindrical, rod, tube, or fibrous shape with an evident elongated longitudinal axis, which is longer than the other dimensions (e.g., diameter or width), thus having an axial anisotropic geometry. Generally, an aspect ratio (AR) for cylindrical shapes (e.g., a wire, pillar, a rod, tube, fiber, etc.) is defined as AR=L/D, where L is the length of the longest axis (here the major longitudinal axis) and D is the diameter of the cylinder or pillar. Suitable axial geometry particles for use in the present technology generally have high aspect ratios, for example, ranging from at least about 100 to in excess of 1,000, for example. In yet other aspects, such axial geometry particles may have an aspect ratio of 5,000 or more and in certain variations 10,000 or more. The axial geometry particles will generically be referred to as "nanowires" herein. It should be noted that other particles are also contemplated for use in alternative variations of the present disclosure, such as flakes or other particles that do not have an axial geometry.

In certain aspects, the plurality of nanowires or nanotubes comprises microparticles or nanoparticles. A "microparticle" as used herein encompasses "nanoparticles," as discussed below. In certain variations of the present teachings, a microparticle component has an axial geometry with an evident longitudinal axis, as defined above, and further has at least one spatial dimension that is less than about 1,000 µm (i.e., 1 mm), optionally less than or equal to about 100 µm (i.e., 100,000 nm). The term "micro-sized" or "micrometer-sized" as used herein is generally understood by those of skill in the art to mean less than about 500 µm (i.e., 0.5 mm). As used herein, a microparticle has at least one spatial dimension that is less than about 10 µm (i.e., 10,000 nm), optionally less than about 5 µm (i.e., 5,000 nm), optionally less than about 1 µm (i.e., 1,000 nm), optionally less than about 0.5 µm (i.e., 500 nm), and in certain aspects less than or equal to about 0.1 µm (i.e., 100 nm).

In preferred aspects, the axial geometry nanoparticles are "nano-sized" or "nanometer-sized" and have at least one spatial dimension that is less than about 1 µm (i.e., 1,000 nm), optionally less than about 0.5 µm (i.e., 500 nm), optionally less than about 0.4 µm (i.e., 400 nm), optionally less than about 0.3 µm (i.e., 300 nm), optionally less than about 0.2 µm (i.e., 200 nm), and in certain variations, optionally less than about 0.1 µm (i.e., 100 nm). Accordingly, a nanoparticle component has at least one spatial dimension that is greater than about 1 nm and less than about 1,000 nm (1 µm). In certain variations, a nanoparticle may have at least one spatial dimension of about 5 nm to about 500 nm. It should be noted that so long as at least one dimension of the nanoparticle falls within the above-described nano-sized scale (for example, diameter), one or more other axes may well exceed the nano-size (for example, length and/or width). In certain variations, where the axial geometry nanocomponent is a nanowire, it has a length of less than or equal to about 10 µm, for example, optionally from greater than or equal to about 5 µm to less than or equal to about 10 µm.

In certain variations, the plurality of electrically conductive axial particles used in accordance with the present teachings is selected from the group consisting of: silver nanowires, copper nanowires, gold nanowires, nickel nanowires, chromium nanowires, nanowires comprising a copper core and a silver shell, carbon nanotubes, graphene oxide tubes, metal-coated electrically spun fibers, and combinations thereof. In certain alternative variations, the electrically conductive particles may have a shape other than electrically conductive axial particles, and may be plates or flake-shapes, such as graphene oxide flakes. In certain preferred aspects, the electrically conductive axial particle is a silver nanowire. FIGS. 2A-2B show SEM images of short AgNWs (5 µm-long, 50 nm-diameter) that are suitable for use in accordance with certain methods of the present disclosure.

The liquid material may be suspension that includes the plurality of electrically conductive axial geometry particles, such as silver nanowires (AgNWs) and a liquid carrier that comprises a liquid, such as a solvent (e.g., water), in which the particles are suspended. Thus, in certain variations, the liquid carrier may be aqueous and comprise water and/or one or more other aqueous solvents. FIG. 1E shows a schematic of the process of the patterned substrate having AgNWs deposition by dip-coating in a liquid material suspension. For dip-coating, patterned substrates are immersed horizontally in the liquid material comprising AgNW solution for a predetermined period of time, such as about 20 minutes and then may be rinsed briefly (e.g., 30 seconds in DI water). After this, the substrates may be rinsed again in DI water by withdrawing from a rinsing bath and drying vertically. The withdrawing rate may be in the range of from greater than or equal to about 1 mm/s to less than or equal to about 20 mm/s. Faster withdrawal appears to result in variable results, while slower withdrawal rates result in the absence of nanowires in the grooves.

After AgNW deposition, the substrates are stored under dry air conditions. Owing to surface energy difference between top and bottom layer, AgNW locate within the trench or grooves spontaneously. A few AgNWs may still remain on the hydrophobic layer, but these nanowires are easily removed after the deposition process. For example, the excess nanowires on the lands may be removed by use of a doctor blade or razor blade being scraped along the substrate surface. FIG. 1D shows the substrate 20 after immersion in the liquid material, where a plurality of electrically conductive axial geometry particles 40 (e.g., silver nanowires) is disposed in the grooves 24 of the groove pattern 26 within the substrate 20, where each of the axial geometry particles 40 is substantially aligned along the groove axis.

By substantially aligned, as shown in FIGS. 3A-3B, it is meant that a first axial geometry particle 42 has a first major longitudinal axis "a" and a second axial geometry particle 44 has a second major longitudinal axis "b." First and second major longitudinal axes "a" and "b" are considered to be "substantially aligned" with one another along a predetermined orientation when the angle formed between them (shown as offset angle Θ in FIG. 3B, between exemplary axes a and b) is less than or equal to about 15°, optionally less than or equal to about 10°, optionally less than or equal to about 5°; optionally less than or equal to about 4°; optionally less than or equal to about 3°; optionally less than or equal to about 1°. As they axial geometry particles are disposed within a groove, they are also substantially aligned with respect to a longitudinal axis of a groove. As can be appreciated by those of skill in the art, a plurality of axially-shaped particles 40 can be considered to be "substantially aligned" in a predetermined single orientation when an average offset angle Θ is small for all of the particles in line with the amounts specified above, although individual nanowire particles may have major longitudinal axes that have a greater angle of deviation from the longitudinal axes of the other microparticles than those specified. In various aspects, the transparent conductor has a plurality of electrically conductive axial particles substantially aligned along a common single axis, for example, the major longitudinal axis defined by a groove.

FIG. 1F is a schematic of a comparative system for forming a transparent conductor, where the surface of the substrate is untreated (lacking any hydrophilic and hydrophobic domains) and therefore not subjected to steps shown in FIGS. 1B-1C. After immersion in the liquid material comprising the AgNWs, the axial geometry silver nanowires are randomly distributed and not located or aligned within the grooves. FIG. 1G shows a schematic of a substrate subjected to the process steps described in FIGS. 1A-1C according to certain variations of the present disclosure, where the axial geometry particles (silver nanowires) are advantageously aligned within the hydrophilic domains corresponding to the grooves along the groove major axis (also as shown in side view in FIG. 1D).

FIGS. 4A-4B are SEM images of a patterned glass substrate. In FIG. 4A, the glass substrate is etched by a dry etching process to create a linear groove pattern. The groove width is about 3 μm, the groove depth is about 3 μm, and the spacing distance between adjacent grooves is about 25 μm. In FIG. 4B, the upper land regions on top have a hydrophobic layer comprising octadecyltrichlorosilane (OTS), whereas the bottom part in the grooves has a hydrophilic layer following RCA cleaning.

Surface energy differences between top surface lands and the patterned grooves on the substrate help the nanowires to selectively locate within the grooves upon immersion in the liquid material. This approach provides not only uniform orientation of the nanowires, but also well-defined spacing in nanowire positioning on a micron scale controlled by the dimensions of the hydrophilic and hydrophobic patterned surface areas. This enables AgNWs to be absent on the surface of the substrate, except in the grooves, thus providing a high level of optical transparency. The high density and aligned AgNWs also ensure a high level of electrical conductivity.

In another variation, selective deposition of AgNWs is conducted on a patterned substrate. This procedure produces chemically distinct surfaces with well-defined periodicity via the microcontact printing. The micropatterned surface is composed of alternating hydrophilic and hydrophobic stripes. FIGS. 5A-5C show optical microscopic images of AgNWs distribution on a patterned glass substrate. In FIG. 5A, the substrate is shown before stamp printing with a hydrophobic OTS material. FIG. 5B shows the substrate after stamp printing with the hydrophobic OTS material. FIG. 5C is an SEM image of patterned AgNWs on the glass substrate. Without OTS stamp transfer printing (as in FIG. 5A), AgNWs are observed to be randomly distributed. However, after hydrophobic treatment (as in FIG. 5B), most of the AgNWs are observed to align into a groove or trench on their own. The electrical conductivities of the AgNW are investigated using a digital multimeter, which shows a sheet resistance of 3.5 Ohms/Square with a transmittance of 75%, as shown in FIG. 5D. This demonstrates that AgNWs on the micro patterned glass prepared in accordance with certain aspects of the present disclosure have significantly reduced electrical resistivity. Without being bound by any particular theory, the reason for the low resistance is believed to be the making of a bundle array and coordinate bonding within the AgNW conductive network.

To obtain higher transparency, a 0.8 μm-width linear groove mesh pattern is formed. The glass substrates are first cleaned and a 2 μm thick positive photoresist, Dow MEGAPOSIT SPR™ 220-3.0, is spin-coated at 5000 rpm for 30 seconds. Following a soft baking at 115° C. for 1 min, an i-line 5 reduction stepper (GCA AS200 AutoStep) is used for patterning sub-micron mesh patterns. The photoresist is then developed in AZ MIF-300 developer for 1 minute. In this manner, a plurality of grooves forms a groove pattern on the substrate via dry etching. The groove pattern defines a plurality of grooves interspersed with lands defining a two-dimensional array.

Therefore, in certain aspects, the present disclosure provides methods of making a transparent conductor, such as a transparent conductive electrode, that includes creating a groove pattern on a substrate. Creating the groove pattern may be done via a photolithographic technique or a mechanical-based patterning process such as nanoimprint lithography. The groove pattern thus defines a two-dimensional array. Then, an electrically conductive material may be selectively applied within the groove pattern of the substrate so as to create the transparent conductive electrode. In various aspects, the transparent conductive electrode thus formed has a sheet resistance of less than or equal to about 5 Ohms/Square and a transmissivity of greater than or equal to about 50% for a predetermined range of target wavelengths of electromagnetic energy. The method may include selectively applying the electrically conductive material within the groove pattern of the substrate.

In one variation, a liquid material comprising a plurality of electrically conductive particles may thus be applied within grooves of the groove pattern. The electrically conductive particles may be any of those described above, including electrically conductive axial geometry particles that have a length of less than or equal to about 10 micrometers. The method may further remove any residual liquid material from the surface of the substrate external to the grooves, for example, by use of a doctor or razor blade. In other aspects, the method may remove the electrically conductive axial geometry particles from the surface of the substrate external to the grooves by use of a doctor or razor blade scraped against the surface.

Accordingly, in certain aspects, the present disclosure contemplates a method of making a transparent conductor that comprises filling a plurality of grooves that defines a two-dimensional array on a surface of a substrate with a liquid material. The liquid material comprises a plurality of electrically conductive axial particles and a liquid carrier. Then, any excess liquid material may be removed (e.g., by drying) from regions of the surface of the substrate external to the grooves. This process may be accelerated by exposing the substrate to heat or reduced pressure conditions. The liquid carrier can be removed to form electrically conductive structures comprising the electrically conductive axial particles in the two-dimensional array thus creating the transparent conductor. Desirably, the transparent conductor has a sheet resistance of less than or equal to about 5 Ohms/Square and a transmissivity of greater than or equal to about 50% for a predetermined range of target wavelengths of electromagnetic energy. Prior to the filling, the method may include further treating the surface of the substrate to be hydrophobic in the regions external to the plurality of grooves. The electrically conductive particles may be any of those described above, including electrically conductive axial geometry particles that have a length of less than or equal to about 10 micrometers.

In certain other variations, a method of making a transparent conductor comprises applying an electrically conductive initiator layer over a surface of the substrate. As noted above, nanoimprint lithography or other mechanical imprinting techniques may also be used to form a groove pattern. The method may include creating a mask over the electrically conductive initiator layer that defines the groove pattern. The mask may be created via photolithographic application of a radiation sensitive resist material, such as the process described above in the context of FIG. 1A. Then, an electrically conductive material may be selectively applied within the groove pattern. In certain variations, the selective application process may be an electrolytic deposition process, such as electroplating, of an electrically conductive material. In other variations, described further below, the selective application process may be an electroless deposition process.

By "electrolytic" it is meant that the coating is applied to a surface of a substrate in the presence of an applied voltage or potential during the deposition process, typically while immersing the surface in a liquid medium having an electrolyte. In contrast, an "electroless" process means that the electrically conductive material is applied to a surface of a substrate in an electroless process without use of an applied voltage or potential during the deposition, also while the surface is in contact with a liquid medium. Electroless plating generally refers to a chemically applied metal-based coating, where the depositing of the metal material occurs via an autocatalytic deposition reactions, rather than being driven by presence of an electrical current or potential. The electroless deposition process can provide a thin, highly controlled, uniform density coating with continuous surface coverage. For an electroless process, the initiator layer can serve as a catalytic layer that promotes deposition of the electrically conductive material is the subsequent electroless deposition.

Finally, the mask may be removed from the substrate to form a transparent conductor having, a two-dimensional array of the electrically conductive material. Such a transparent conductor advantageously has a sheet resistance of less than or equal to about 5 Ohms/Square and a transmissivity of greater than or equal to about 50% for a predetermined range of target wavelengths of electromagnetic energy. In certain variations, the electrically conductive material may be selected from the group consisting of: silver, gold, copper, nickel, chromium, alloys, and combinations thereof. The initiator layer may be formed of the same or distinct electrically conductive materials. In certain variations, the initiator layer comprises a conductive oxide, such as indium tin oxide or fluorine-doped indium fin oxide or a conductive metal, such as silver, palladium, or copper, by way of example. In certain other variations, the initiator layer comprises a metal selected from the group consisting of: silver, palladium, copper, and combinations thereof and the electrically conductive material comprises a metal selected from the group consisting of: copper, nickel and combinations thereof. In certain variations, the initiator layer comprises copper and the electrically conductive material comprises copper. In other variations, the initiator layer comprises silver and the electrically conductive material comprises copper.

One method for making a transparent conductor in accordance with certain aspects of the present disclosure is illustrated in the schematic of FIG. 6. The fabrication process produces a transparent conductor that can be used to create a tortuous micromesh antenna. Copper is employed as the electrically conductive material for the antenna because of its excellent conductivity ($59.6 \times 10^6$ S/m), ductility, low cost, and light weight, although other electrically conductive materials are also feasible. In step 1, a fused silica substrate 60 is first coated with an alumina ($Al_2O_3$) layer 62 followed by a 150 nm thick a-Si layer deposited by PECVD, which works as a sacrificial layer 64 that will be removed later in the fabrication process. A 40 nm Cu film is deposited on the substrate to serve as the seed or initiator layer 66 for the subsequent Cu electro-plating. Alternatively, a conductive substrate can be used that eliminates the need to employ an additional seed or initiator layer. Such a conductive substrate may be ITO, by way of example.

A groove pattern includes a plurality of tortuous grooves that together define a tortuous micromesh for use in the antenna, which is created by a photolithography process in step 2. In other variations, a nanoimprint lithographic process may be used. A mask may be created over the surface of the substrate 60. The mask may be created via photolithographic application of a radiation sensitive resist material 70 over the initiator layer 66. The radiation sensitive resist material 70 may be patterned in a process like that described above in the context of FIG. 1A and thus a plurality of openings 72 are formed therein. The patterned resist material 70 (e.g., MEGAPOSIT™ SPR™ 220-7.0 positive photoresist commercially available from Dow Chemical Comp.) is thus used as the mask for the Cu electroplating (shown in step 3). After Cu electroplating in step 3, an electrically conductive material 74 layer is formed within the openings 72 in the resist material 70 mask that defines discrete conductive structures. Because the initiator layer 66 is formed of the same material as the electrically conductive material 74, it forms a monolithic structure. Where the initiator layer 66 is formed of a distinct metal, it would remain a distinct layer beneath the electrically conductive material 74 layer. As shown, a 4.7 μm thick tortuous Cu mesh pattern is deposited within the openings 72 in the resist material 70 of the photolithographic mask (deposited on the initiator layer 66). After the resist material 70 is removed in step 4, the Cu conductive mesh of discrete conductive structures is, created from the electrically conductive material 74 layer. See FIGS. 8A-8E, 9C, 10A-10F, and 11A-11C for exemplary tortuous mesh pattern embodiments.

In certain variations, the methods of the present disclosure may further include applying an elastomeric material 80 over the substrate 60 defining discrete structures of the electrically conductive material 74, as shown in step 5. The elastomeric material 80 may be a polydimethylsiloxane that encapsulates the electrically conductive material 74 structures. The elastomeric material 40 and the discrete structures of the electrically conductive material 74 (e.g., Cu structures) can be removed from the substrate 60 by dissolving and/or removing sacrificial layer 64. For example, a selective gas etching process may be used to remove a-Si material. A separated transparent conductor 90 is thus formed that includes an elastomeric material 80 having the electrically conductive material 74 embedded therein to form a two-dimensional array.

In another variation, a metal grid type high-performance transparent conductor is fabricated by solution-processed metal patterning using two step electro-less metal deposition as shown in FIG. 7A. This method provides uniform, stable, and large scale metal grid structure on a substrate, which may be either rigid or flexible.

First, a substrate 110 is treated to form a groove pattern. The method may include creating a mask over the surface of the substrate. The mask may be created via photolithographic application of a radiation sensitive resist material 112, such as the process described above in the context of FIG. 1A. In one exemplary embodiment, glass substrates (Corning® microscope slides) can be sized as desired, for example, cut in rectangular pieces of approximately 2.5 cm×2.5 cm. The substrates are first cleaned and a 2 μm thick positive photoresist (Dow MEGAPOSIT™ SPR™ 220-3.0) is spin-coated at 5000 rpm for 30 seconds. Following a soft baking at 115° C. for 1 minute, a contact aligner is then used for patterning 3 μm wide grating patterns. The photoresist is then developed in AZ MIF-300 developer for 1 minute. The wafer is then rinsed in the water and dried with nitrogen gas. The glass etching is performed by STS Pegasus glass etcher with $C_4F_8$/He gas mixture for 15 minute. It should be noted that dry etching can be replaced by wet-chemical etching, e.g., by using HF. In this manner, the substrate defines a groove pattern 120 comprising a plurality of grooves 122 and a plurality of lands 124 created on a substrate 110 that defines a two-dimensional array.

Then, an initiator layer 130 is selectively applied over a surface of the substrate 110 in the grooves 122, but not on the lands 124. The electrically conductive initiator layer 130 serves as a catalytic layer for subsequent electrolessly deposited conductive metals. An electrically conductive material 132 may then be selectively applied over the initiator layer 130 within the grooves 122, but not on the lands 124. In this method, the selective application process is conducted via electroless deposition of an electrically conductive metal to form the discrete structures of the electrically conductive material 132 layer.

In certain variations where the deposition method employs electroless deposition, the electrically conductive material may be selected from the group consisting of: copper, nickel, alloys, and combinations thereof. The initiator layer may be formed of the same or distinct electrically conductive materials. In certain variations, the initiator layer comprises a conductive metal, such as silver, palladium, or copper, by way of example. In certain other variations, the initiator layer comprises a metal selected from the group consisting of: silver, palladium, copper, and combinations thereof and the electrically conductive material comprises a metal selected from the group consisting of: copper, nickel, and combinations thereof. In other variations, the initiator layer comprises silver and the electrically conductive material comprises copper.

For example, in one variation, 0.1 g of silver nitrate is added into 2.5 mL of aqueous ammonium hydroxide solution at room temperature. The prepared solution is mixed with 1 g of gluconolactone by titration. Freshly mixed solution is coated on the glass substrate with the photoresist patterns. This process electrolessly deposits a thin layer of silver (Ag) inside the etched glass channel defining each groove 122. The silver serves as the initiator layer 130. During the reaction, the photoresist/radiation sensitive resist material 112 is dissolved naturally by the alkalinity of the coated solution. Therefore, Ag is selectively deposited inside the trench/groove 122, while none is deposited on the lands 124 of the exposed glass surface.

The next step is electroless plating of copper or another conductive metal by using the deposited thin Ag initiator layer as a catalyst layer. Copper plating solution is prepared by mixing 7% of copper(II)sulfate solution and tartrate solution (potassium sodium tartrate tetrahydrate). The prepared glass substrate having the initiator layer 130 in the grooves 122 is immersed into freshly prepared copper electroless deposition solution to form a copper layer (electrically conductive material 132 layer) on silver seed layer (initiator layer 130). FIGS. 7B and 7C show an optical image and scanning electron microscope image of a sample fabricated by such an electroless deposition process. FIG. 7D shows transmittance over a range of wavelengths of the transparent conductor formed by such an exemplary electroless deposition process, which has good transmittance over a wide range of wavelengths, comparable to ITO and a glass substrate having no metal whatsoever. Such a transparent conductor advantageously has a sheet resistance of less than or equal to about 5 Ohms/Square and a transmissivity of greater than or equal to about 50% for a predetermined range of target wavelengths of electromagnetic energy. Such a transparent conductor may have any of the properties previously described above.

In certain variations, the methods of the present disclosure may further include applying an elastomeric material over the substrate after the selectively applying the electrically conductive material and removing the elastomeric material from the substrate, where the elastomeric material comprises the electrically conductive material embedded in the elastomeric material in the two-dimensional array. In certain aspects, transparent conductors thus formed are stretchable and/or flexible (e.g., capable of bending without mechanical failure). Furthermore, it is desirable that such transparent conductors are capable of maintaining high levels of electrical conductivity even when stretched. The present disclosure provides in certain aspects, a flexible or stretchable transparent conductor, such as a conductive electrode. By "stretchable" it is meant that materials, structures, components, and devices are capable of withstanding high levels of strain, without fracturing or other mechanical failure. Stretchable or flexible materials in accordance with certain aspects of the present disclosure are extensible and thus are capable of stretching and/or compression, at least to some degree, without damage, mechanical failure or significant degradation in performance.

"Young's modulus" is a mechanical property referring to a ratio of stress to strain for a given material. Young's modulus may be provided by the expression:

$$E = \frac{(\text{stress})}{(\text{strain})} = \frac{\sigma}{\epsilon} = \frac{L_o}{\Delta L} \times \frac{F}{A}$$

wherein engineering stress is σ, tensile strain is ε, E is the Young's modulus, $L_O$ is an equilibrium length, ΔL is a length change under the applied stress, F is the force applied and A is the area over which the force is applied.

In certain aspects, stretchable materials, structures, components, and devices may undergo a maximum tensile strain of at least about 15% without fracturing; optionally greater than or equal to about 25% without fracturing, optionally greater than or equal to about 50% without fracturing, optionally greater than or equal to about 100% without fracturing, optionally greater than or equal to about 150% without fracturing, and in certain variations, optionally greater than or equal to about 200% without fracturing.

Stretchable materials provided by the present disclosure may also be flexible, in addition to being stretchable, and thus are capable of significant elongation, flexing, bending or other deformation along one or more axes. The term "flexible" can refer to the ability of a material, structure, or component to be deformed (for example, into a curved shape) without undergoing a permanent transformation that introduces significant strain, such as strain indicating a failure point of a material, structure, or component.

Thus, the present disclosure provides in certain aspects, a flexible and/or stretchable electrically conductive composite material that comprises a polymer and a plurality of conductive nanoparticles, such as axial geometry nanowires. The polymer may be an elastomeric or thermoplastic polymer and in certain aspects, may have a strain equal to or exceeding about 50%, and in certain aspects, optionally with a strain limit of greater than or equal to about 100%. Such an elastomer may be polydimethylsiloxane that is also transparent to the predetermined range of wavelengths of light. In certain variations, the elastomer may be polydimethylsiloxane (PDMS) and the electrically conductive material comprises silver or copper.

With renewed reference to FIG. 6, at step 5 the patterned electrically conductive mesh may be encapsulated by a polydimethylsiloxane (PDMS) layer, which is flexible and optically transparent. It is also used for maintaining the shape of micromesh, as well as protecting the metal wire from mechanical damage when they are stretched. A total thickness of PDMS is about 400 μm. Then the PDMS and the Cu mesh embedded in it are separated from the substrate by removing the a-Si layer by xenon di-fluoride ($XeF_2$) gas. Finally, another PDMS layer is laminated onto the Cu mesh side to conclude the flexible transparent electrode that can be used as an antenna.

Thus, in certain aspects, a method of making a flexible transparent conductor is provided that includes first creating a groove pattern on a substrate that defines a two-dimensional array. Then, an electrically conductive material is selectively applied within the groove pattern of the substrate. An elastomeric material is then applied over the substrate after the selectively applying the electrically conductive material. Finally, the elastomeric material is removed from the substrate, where the elastomeric material comprises the electrically conductive material embedded in the elastomeric material in the groove pattern. This creates a flexible transparent conductor having a sheet resistance of less than or equal to about 5 Ohms/Square and a transmissivity of greater than or equal to about 50% for a predetermined range of target wavelengths of electromagnetic energy.

Furthermore, when the flexible transparent conductor is stretched by 20%, an electrical conductivity of the flexible transparent conductor is maintained so that the electrical conductivity in the stretched states is reduced by less than or equal to about 5% as compared to a comparative conductivity when the flexible transparent conductor is not stretched (0% stretching). In certain other aspects, when the flexible transparent conductor is stretched by 50%, an electrical conductivity of the flexible transparent conductor is reduced by less than or equal to about 10% as compared to a comparative conductivity when the flexible transparent conductor is not stretched.

Such flexible transparent conductors are particularly useful in wearable technologies, such as those that aim to monitor person's wellness or assist people with diseases. For wearable applications, a variety of sensors, antennas, electronic circuits, and storage systems have been developed. Not only should the wearable devices be small and light, they should also be able to communicate with other electronic devices. However, conventional antennas and batteries are heavy and take up a large amount of space in the system. In order to produce more compact and lighter systems, antennas integrated with a rectifying circuit can be employed to harvest RF energy eliminating the need for the battery. Thus, a radio frequency antenna prepared in accordance with certain aspects of the present disclosure plays a significant role for the wearable system.

In certain aspects, the methods of the present disclosure pertain to forming transparent and stretchable radiofrequency small antennas by using a stretchable micromesh structure. These antennas are mechanically reconfigurable and smaller and lighter than the conventional antennas. The reduced size is achieved by using the zeroth-order resonant (ZOR) property. The antennas comprise a series of tortuous micromesh structures, which provides a high degree of freedom for stretching when encapsulated in elastomeric polymers that are optically transparent. Accordingly, the structure can undergo mechanical deformation such as stretching, folding, or twisting without breakage. These antennas can be stretched up to 40% in size without breaking and easily return to their original shape after the force is removed. The increase in the tensile strain results in the resonant frequency of the antennas that is almost linearly reconfigurable from 2.94 GHz to 2.46 GHz. In addition, they are optically transparent due to the large openings in the mesh and the optical transmittance has increased under high strains.

FIGS. 8A-8G show a transparent and stretchable compact zeroth-order resonant (ZOR) coplanar waveguide (CPW)-fed antenna. The antenna shown in FIG. 8A includes a metallic patch, a shorted meander line, an interdigital slot, and CPW ground. In order to be stretchable and optically transparent, the uniform metallic patches in the traditional antenna configuration are replaced with a tortuous wire micromesh design, as described above. It can be replaced without loss of performance, because the periods of mesh are roughly smaller than $\lambda_0/1100$, where $\lambda_0$ is free space wavelength.

An infinitesimal circuit model for the lossless unit cell of ENG MTL model may be represented as the combination of a per-unit length series inductance ($L_R$), and a shunt capacitance ($C_R$), and a per-unit length shunt inductance ($L_L$). The shunt components of the unit cell are obtained from the shunt capacitance between the top patch and CPW ground, and a shunt inductance of the shorted meander lines. In addition, the $L_L$ and $C_R$ include additional inductance and capacitance formed by the tortuous metal micromesh. The coupling capacitance ($C_c$) created by an interdigital capacitance in the equivalent circuit model of ZOR antenna is introduced and responsible for only impedance matching. Given that only shunt components ($Y_{ENG}$) of the unit cell determine the resonant frequency of the open-ended resonator, the average electric energy and the average magnetic energy are stored in the shunt capacitor ($C_R$) and the shunt inductor ($L_L$), respectively.

From an infinitesimal circuit model for the lossless unit cell of epsilon negative (ENG) meta-structured transmission line (MTL) model, the effective permeability and permittivity of the MTL materials are obtained as $\varepsilon_{ENG}=Y_{ENG}/j\omega=C_R-1/\omega^2 L_L$ and $\mu_{ENG}=Z_{ENG}/j\omega=L_R$, where Z and Y are the per-unit length impedance and admittance, respectively. If the frequency band ($\omega$) is smaller than $1/\sqrt{L_R C_R}$, the ENG MTL has positive permeability and negative permittivity so that it has single negative stopband. The ENG has the unique characteristic of an infinite-wavelength wave at the boundary of passband and stopband. Therefore, zeroth-order resonance occurs when the MTL has zero permittivity. Based on the open-ended structure, the resonant frequency of the mechanically reconfigurable antenna based on ENG MTL is determined by $$\omega = \frac{1}{\sqrt{L_L C_R}} \; [1/s] \quad (2)$$

where $L_L$ is the inductance of shorted meander line and $C_R$ is the capacitance between the metallic patch and CPW ground respectively as shown in FIGS. 8F-8G. This indicates that the ZOR frequency is determined only by the shunt inductance and capacitance and therefore independent of the physical length of the resonator. Thus, a small antenna based on the zeroth-order condition is implemented and the resonant frequency of the antenna can be controlled with applied mechanical force. In addition, to obtain the change the inductance ($L_L$) by applying mechanical means, the vertically oriented meander line is used than the horizontally oriented meander line in the antenna as shown in FIG. 8A.

The orientation of a meander line is shown in FIGS. 10A-10F, where meander-shape inductors are positioned in vertical and horizontal orientations, respectively. The meander line is connected between the metallic patch and the CPW ground as shown in FIG. 8A. It can be modeled as an equivalent inductor because it is considered as a shorted transmission line. In order to realize the meander line, the tortuous meshed conductors are orthogonally placed. The vertically-oriented meander line has longer conductors with length $l_{v1}$ and width $w_{v1}$ in the direction of force and shorter conductors with length $l_{v2}$ and width $w_{v2}$ in the perpendicular direction of force as shown in FIGS. 8A and 10A-10C. Appropriate self and mutual inductance values are determined by the optimal arrangement of the size parameters. According to the applied tensile strains, the parameters of the vertically-oriented meander line are changed. The $l_{v1}$ and $w_{v2}$ increases, and $l_{v2}$ and $w_{v1}$ decreases. The horizontally-oriented meander line includes shorter conductors with length $l_{h2}$ and width wh1 in the direction of force and longer conductors with length $l_{h1}$ and width $w_{h2}$ in the perpendicular direction of force as shown in FIGS. 8B-8C and 9D-9F. When the tensile strain is applied in the vertical direction as shown in FIGS. 9D-9F, the $l_{h2}$ and $w_{h2}$ of the horizontally-oriented meander line increases and $l_{h1}$ and $w_{h1}$ decreases.

Table I shows inductance of meander line according to the orientations and tensile strains.

TABLE I

| | TENSILE STRAIN (%) | 0% | 20% | 40% |
|---|---|---|---|---|
| MTL with vertically oriented meander line | Inductance (nH) | 6.323 | 7.519 | 8.271 |
| | Capacitance (pF) | 0.451 | 0.434 | 0.493 |
| | Calculated resonant frequency (GHz) | 2.98 | 2.78 | 2.49 |
| | Resonant Frequency (GHz) in EM simulation | 2.93 | 2.73 | 2.43 |
| MTL with horizontally oriented meander line | Inductance (nH) | 6.198 | 6.287 | 6.497 |
| | Capacitance (pF) | 0.452 | 0.463 | 0.456 |
| | Calculated resonant frequency (GHz) | 3.01 | 2.95 | 2.92 |
| | Resonant Frequency (GHz) in EM simulation | 3.00 | 2.93 | 2.90 |

The inductances and capacitances are extracted from a circuit (Advanced Design System 2015) and full wave (Ansoft HFSS 15) simulator in terms of the meander line shapes and applied tensile strains, and they are tabulated in Table I.

Table II includes comparative performance values between a metallic patch (shown in FIG. 9A), a straight mesh (shown in FIG. 9B), and a tortuous mesh (shown in FIG. 9C).

TABLE II

| | Metallic Patch | Straight Mesh | Tortuous Mesh |
|---|---|---|---|
| Effective conductivity (S/cm) | $5.96 \times 10^5$ | $2.24 \times 10^4$ | $3.28 \times 10^4$ |
| 10 dB bandwidth (MHz) | 86 | 104 | 101 |
| Resonant frequency (GHz) | 2.940 | 2.943 | 2.941 |
| Realized Gain (dB) | −3.04 | −3.72 | −3.46 |

The values of the circuit parameters ($L_L$, $C_R$) are extracted from the S-parameters. Thus, it shows the influence of the orientation of the meander lines according to the different strains. It appears that when a tensile strain is applied along the vertical direction, the inductance of the vertically oriented meander line varies much more than that of the horizontally oriented meander line. Thus, the vertically oriented meander line is preferred in certain designs to obtain widely mechanically tunable resonances.

The metallic patch of the antenna in FIG. 9A can be replaced with a micromesh in FIG. 9B or 9C, which are optically transparent as well as having good electric conductivity. The straight wires may have a wound shape to be stretchable, so that it effectively leads to the miniaturization of the linear dimension of the micromesh. The antennas based on metallic patch, straight mesh, and tortuous mesh in FIGS. 9A-9C are simulated in Ansoft HFSS and the 10 dB bandwidth, resonant frequency, and realized gain are tabulated in Table II above.

Although the tortuous mesh has slightly broader 10 dB bandwidth and lower gain because of low conductivity, it still has same resonant frequency compared with metallic patch. Typically the metallic patch and straight mesh are easily broken with a small tensile strain because of the high Young's modulus (117 GPa) of the copper. In order to withstand the applied tensile strains, the strength applied to the mesh is ideally lower than the yield strength. Prior to the yield point, the material can be deformed elastically and will return to its original shape when the applied stress is removed. To decrease the stress applied to the mesh and increase the structural ability of mesh to be elongated, the straight lines of straight mesh are wound.

Thus, in certain variations, a tortuous metallic mesh is used rather than a straight wire mesh. Such a tortuous mesh may be fabricated by a method like that described in the context of FIG. 6, for example. Specifically, two types of tortuous meshes are used to fabricate structurally stretchable and optically transparent antennas in this example. FIGS. 11A-11C show the mechanical simulation of meshes with Comsol 4.4. The results are based on finite element method (FEM) and present the calculated stress localized in the stretched mesh. In the tortuous micromesh formed according to certain variations of the present disclosure, the maximum stress is 44.14 MPa with 50% of tensile strain. Because of this characteristic, the inventive tortuous micromesh is more durable than straight line mesh in terms of the tensile strain. To make the tortuous wire micromesh structure, it is worth noting that the narrower wires tend to be more stretchable than the wider ones. Thus, to withstand the applied tensile strains, the geometrical parameters of the unit cells of the micromesh are optimized and determined. FIGS. 11B and 11C show the detailed view of the unit cells of two tortuous wire micromesh designs according to the present disclosure.

In order to avoid multiple contacts at the intersection of the wires, the first tortuous mesh is designed by mixing tortuous wires with tortuous lines with a period of 78.25 µm in the horizontal direction and a period of 63.18 µm in longitudinal direction, respectively, as shown in FIG. 11B. Between the intersections in the horizontal direction, the wires with a high undulation amplitude and a short period are connected to increase the ability of wires to elongate. The second tortuous mesh is designed with a tortuous line with a period of 78.25 µm in horizontal direction and the straight line with a period of 60 µm in the longitudinal direction, as shown in FIG. 11C. In addition to the elongation, another advantage of using the tortuous mesh is that the linear dimension along the current path of the antenna is reduced while at the same time maintaining good optical transparency and electrical conductivity.

Generally optical transparency and electrical conductivity change in opposite directions. The figure of merit has been widely used to evaluate the overall performance of transparent conductors. The Figure of Merit (FoM) is defined as the ratio of the electrical conductivity to optical conductivity ($\sigma_{dc}/\sigma_{op}$) where $\sigma_{dc}$ is the electrical conductivity at DC and $\sigma_{op}$ is the sheet conductivity in the optical frequency range. The larger FoM represents the better performance, and the optical transparency (T) is determined by $$T = \frac{1}{\left(1 + \frac{Z_0}{2R_S}\frac{\sigma_{op}}{\sigma_{dc}}\right)} \quad (3)$$

where $Z_0$ is the free space impedance (377Ω) and $R_S$ is the sheet resistance of the metallic tortuous micromesh. T is typically measured at a wavelength λ=550 nm which is the maximum of the human eye luminosity. The FoM of the tortuous micromesh according to the present disclosure is more than 5 k, which is much higher than other transparent conductive electrodes.

An exemplary antenna may be made by the method described in the context of FIG. 6. The antenna is fabricated by depositing copper in tortuous grooves via electroplating, removing the resist, and then embedding the copper two-dimensional array in a commonly used elastomer PDMS with a relative permittivity of $\varepsilon_r$=2.80 and loss tangent of tan δ=0.02. The fabricated antenna is connected to an SMA connector. The impedance of the antenna is matched to 50 Ohm. The antenna is measured using a vector network analyzer (Agilent E5071B). The conductivities of the meshes measured by 4 points probe are used as the effective conductivities in full wave simulation.

Simulated and measured return loss ($S_{11}$), alone with increasing the tensile strains (0%, 20%, and 40%), are studied. As the tensile strains increase, the resonant frequencies of antennas decrease from 2.94 GHz to 2.46 GHz, which shows good agreement between the simulated and measured results. The mechanical stretching device is used to obtain the different stretchability in the measurement. The measured conductivity and thickness of the fabricated micromesh is used to simulate the antenna. The overall area of the radiating aperture is very small and approximately $0.08\lambda_0 \times 0.11\lambda_0 \times 0.004\lambda_0$ (8.32 mm×11.6 mm×0.4 mm) at 2.92 GHz. The optical transmittances of the tortuous micromesh structure increase with increased stretching because of the large opening ratio of the mesh, which measures 32-44% in the wavelength range of 400-800 nm depending on the level of stretching (i.e., strain ratio) as shown in FIG. 12.

The radiation patterns of the fabricated antenna are measured using the University of Michigan's anechoic chamber. The antenna under test (AUT) is placed on a rotating Styrofoam platform in the chamber. The AUT is then connected to a signal generator (Agilent N5183A). A standard horn antenna is connected to a spectrum analyzer (Hewlett Packard 8529L) to measure the received power by using a data acquisition program. By rotating the AUT, the received power is measured by the horn antenna so that the radiation patterns are measured. Combined with the measured values, the antenna gain is calculated using the gain comparison method. In this method, Friis Transmission formula is utilized for the calculation of the unknown antenna gains. To do this, the AUT is replaced with a reference horn antenna with a known gain. By comparing the received power of the AUT and the reference antenna, the gain can be calculated. FIGS. 13A and 13B show the measured radiation patterns on the xz-plane (E-plane) and yz-plane (H-plane) at 2.92 GHz for Designs 1 and 2. Design 1 is a tortuous micromesh shown in FIGS. 8B-8C and 11B, where a unit cell has both tortuous wires (formed by tortuous grooves) in horizontal and longitudinal directions. Design 2 is another tortuous micromesh embodiment shown in FIGS. 8D-8E and 11C, where a unit cell of the mesh has a tortuous wire (formed by a tortuous groove) in a horizontal direction and straight wire (formed by a linear groove) in a longitudinal direction.

As the tensile strains are increased from 0% to 40%, the measured gains slightly decrease because their effective conductivity is decreased. According to the increase of the tensile strains, the measured gains of the antenna for Design 1 has the −0.21 dBi, −0.39 dBi, and −0.53 dBi, respectively. In addition, the measured gains of the antenna for Design 2 has the −0.02 dBi, −0.02 dBi, and −0.29 dBi, respectively. As the tensile strain is applied from 0% to 40%, the antenna gain is slightly decreased because the effective conductivity slightly varies from $3.28 \times 10^4$ S/cm to $3.12 \times 10^4$ S/cm.

FIG. 14 shows measured radiation patterns in response to the increase of the tensile strain (0%, 20%, and 40% tensile strain levels). The radiation patterns of the antenna are not significantly changed by the applied tensile strains. The overall antenna performances of an antenna prepared in accordance with the present disclosure is compared with those of previously reported flexible antennas in Table III.

as well as structural stretchability. In addition, they can be a smaller size than other flexible antennas because of the use of the zeroth-order mode.

Accordingly, the present disclosure provides methods of forming transparent conductors, including transparent conductive electrodes. For example, such a transparent conductor can be used as a reversibly deformable and frequency reconfigurable small antenna by utilizing the tortuous micromesh structures, which provide excellent electric conductivity, flexibility, stretchability, as well as optical transparency. The resonant frequency can be tuned by mechanically elongating the meandering line of the antenna. Such tunable antennas can be used for the transparent, flexible, and stretchable radiofrequency wearable applications, by way of non-limiting example.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of making a flexible transparent conductor, comprising:

TABLE III

| Symbol | INVENTIVE EXAMPLE | COMPARATIVE EXAMPLE 1 | COMPARATIVE EXAMPLE 2 | COMPARATIVE EXAMPLE 3 |
|---|---|---|---|---|
| Resonant Frequency [GHz] | 2.92 | 3.45 | 2.1 | 2.92 |
| Gain [dBi] | −0.02 | −2.4 | 12.8 | 0.37 |
| Size [mm$^2$] | 8.32 × 11.6 × 0.4 | 40 × 40 × 1 | 153.2 × 122 × 6.35 | 45 × 40 × 1 |
| Metal materials/Substrate materials | Tortuous Cu micromesh/PDMS | EGaIn/PDMS | E-textile/fabric | AgNWs/PDMS |
| Flexible | ○ | ○ | ○ | ○ |
| Transparent[a] | ○ | X | X | X |

[a]optical transparency for metallic parts

Comparative Example 1 is an antenna formed according to the technique described in G. J. Hayes et al., "Flexible Liquid Metal Alloy (EGaIn) Microstrip Patch Antenna," IEEE Transactions on Antennas and Propagation, vol. 60, pp. 2151-2156 (June 2012), the relevant portions of which are incorporated herein by reference.

Comparative Example 2 is an antenna formed according to the technique described in T. F. Kennedy et al., "Body-Worn E-Textile Antennas: The Good, the Low-Mass, and the Conformal," IEEE Transactions on Antennas and Propagation, vol. 57, pp. 910-918 (April 2009), the relevant portions of which are incorporated herein by reference.

Comparative Example 3 is an antenna formed according to the technique described in S. C. D. Barrio et al., S. C. D. Barrio and G. F. Pedersen, "Antenna Design Exploiting Duplex Isolation for 4G Application on Handsets," Electronics Letters, vol. 49, pp. 1197-1198, September 2013, the relevant portions of which are incorporated herein by reference.

Although the Comparative Examples 1-3 antennas in Table III are flexible, they are not transparent or stretchable. However, because the antennas prepared in accordance with certain aspects of the present disclosure are formed based on the tortuous micromesh, they provide optical transparency, creating a groove pattern on a substrate that defines a two-dimensional mesh array wherein at least two distinct grooves in the groove pattern intersect with one another, wherein the substrate comprises a sacrificial layer over which the groove pattern is formed;

selectively applying an electrically conductive material within the groove pattern of the substrate;

removing at least a portion of the substrate to form a plurality of openings adjacent to the electrically conductive material having the groove pattern;

filling the plurality of openings with a transparent elastomeric material to encapsulate the electrically conductive material, wherein the transparent elastomeric material is formed around and embeds the electrically conductive material; and removing the sacrificial layer by dissolving or etching so as to remove the transparent elastomeric material and the embedded electrically conductive material from the substrate, so as to create the flexible transparent conductor having a sheet resistance of less than or equal to about 5 Ohms/Square and a transmissivity of greater than or equal to about 50% for a target wavelength or a range of target wavelengths of electromagnetic energy in the visible, ultraviolet (UV), and infrared (IR)

ranges, wherein when the flexible transparent conductor is stretched by 20%, an electrical conductivity of the flexible transparent conductor is reduced by less than or equal to about 5% as compared to a comparative conductivity when the flexible transparent conductor is not stretched.

2. The method of claim 1, wherein the transparent elastomeric material is polydimethylsiloxane (PDMS) and the electrically conductive material comprises silver or copper.

3. The method of claim 1, wherein when the flexible transparent conductor is stretched by 50%, an electrical conductivity of the flexible transparent conductor is reduced by less than or equal to about 10% as compared to a comparative conductivity when the flexible transparent conductor is not stretched.

4. The method of claim 1, wherein after the creating the groove pattern, the method further comprises treating a surface of the substrate including the groove pattern to be hydrophilic and then treating regions of the surface of the substrate external to the grooves to be hydrophobic.

5. The method of claim 4, wherein the selectively applying the electrically conductive material within the groove pattern of the substrate comprises applying a liquid material comprising a plurality of electrically conductive axial particles within grooves of the groove pattern.

6. The method of claim 5, wherein the plurality of electrically conductive axial particles has a length of less than or equal to about 10 micrometers.

7. The method of claim 5, further comprising removing any residual conductive axial particles from the surface of the substrate external to the grooves.

8. The method of claim 1, wherein the electrically conductive material is selected from the group consisting of: silver, copper, gold, nickel, chromium, aluminum, zinc, alloys, and combinations thereof.

9. The method of claim 1, wherein the creating the groove pattern comprises a photolithography or nanoimprint lithography technique.

10. The method of claim 1, wherein the creating of the groove pattern further comprises applying an electrically conductive initiator layer over a planar surface of the substrate and creating a mask over the electrically conductive initiator layer that defines the groove pattern, and the selectively applying the electrically conductive material within the groove pattern of the substrate comprises electroplating the electrically conductive material in a plurality of grooves of the groove pattern; and the method further comprises removing the mask from the substrate.

11. The method of claim 1, wherein at least a portion of the substrate comprises an electrically conductive substrate selected from indium tin oxide or a surfactant-modified metal foil.

12. The method of claim 1, wherein the selectively applying the electrically conductive material within the groove pattern of the substrate comprises electrolessly depositing an electrically conductive material within a plurality of grooves in the groove pattern.

13. The method of claim 12, further comprising applying an electrically conductive initiator layer within the plurality of grooves in the groove pattern.

14. The method of claim 13, wherein the electrically conductive material is selected from the group consisting of: copper, nickel, alloys, and combinations thereof and the electrically conductive initiator layer comprises a material selected from the group consisting of: silver, palladium, copper, alloys, and combinations thereof.

15. The method of claim 1, wherein the selectively applying the electrically conductive material within the groove pattern of the substrate comprises electroplating an electrically conductive material within grooves of the groove pattern.

16. A method of making a flexible transparent conductor, comprising:
creating a tortuous groove pattern on a substrate that defines a two-dimensional mesh of tortuous grooves, wherein at least two distinct tortuous grooves intersect with one another and define a meander-shape comprising at least one horizontal meander line and at least one vertical meander line intersecting one another wherein the substrate comprises a sacrificial layer over which the tortuous groove pattern is formed;
selectively applying an electrically conductive material within the tortuous groove pattern of the substrate;
removing at least a portion of the substrate to form a plurality of openings adjacent to the electrically conductive material having the tortuous groove pattern;
filling the plurality of openings with an elastomeric material to encapsulate the electrically conductive material, wherein the elastomeric material is formed around and embeds the electrically conductive material; and
removing the sacrificial layer by dissolving or etching so as to remove the elastomeric material and the embedded electrically conductive material from the substrate, so as to create the flexible transparent conductor having a sheet resistance of less than or equal to about 5 Ohms/Square and a transmissivity of greater than or equal to about 50% for a target wavelength or a range of target wavelengths of electromagnetic energy in the visible, ultraviolet (UV), and infrared (IR) ranges, wherein when the flexible transparent conductor is stretched by 20%, an electrical conductivity of the flexible transparent conductor is reduced by less than or equal to about 5% as compared to a comparative conductivity when the flexible transparent conductor is not stretched.

* * * * *